US012580532B2

(12) United States Patent
Kitajima et al.

(10) Patent No.: US 12,580,532 B2
(45) Date of Patent: Mar. 17, 2026

(54) RADIO-FREQUENCY MODULE AND COMMUNICATION DEVICE

(71) Applicant: Murata Manufacturing Co., Ltd., Kyoto (JP)

(72) Inventors: Hiromichi Kitajima, Kyoto (JP); Takanori Uejima, Kyoto (JP); Rui Tanaka, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 567 days.

(21) Appl. No.: 18/167,225

(22) Filed: Feb. 10, 2023

(65) Prior Publication Data

US 2023/0198478 A1    Jun. 22, 2023

Related U.S. Application Data

(63) Continuation-in-part of application No. PCT/JP2021/029447, filed on Aug. 6, 2021.

(30) Foreign Application Priority Data

Aug. 13, 2020  (JP) ................................. 2020-136579
Oct. 15, 2020  (JP) ................................. 2020-174127

(51) Int. Cl.
 *H03F 3/195*    (2006.01)
 *H03F 1/56*    (2006.01)
  (Continued)

(52) U.S. Cl.
 CPC ............. *H03F 3/195* (2013.01); *H03F 1/565* (2013.01); *H03F 3/245* (2013.01); *H03F 3/68* (2013.01);
  (Continued)

(58) Field of Classification Search
 CPC .......... H03F 3/195; H03F 1/565; H03F 3/245; H03F 3/68; H03F 2200/111;
  (Continued)

(56) References Cited

U.S. PATENT DOCUMENTS 8,451,581 B2 *  5/2013  Chandrasekaran .. H05K 1/0239
                                    361/306.1
2005/0139981 A1 *  6/2005  Kobayashi .......... H01L 23/5227
                                    257/E23.021

(Continued)

FOREIGN PATENT DOCUMENTS

JP    2005-311929 A    11/2005
JP    2012-019091 A    1/2012
  (Continued)

OTHER PUBLICATIONS

International Search Report for PCT/JP2021/029447 dated Sep. 21, 2021.

*Primary Examiner* — Eugene Yun
(74) *Attorney, Agent, or Firm* — McDonald Hopkins LLC

(57) ABSTRACT

A radio-frequency module includes a first inductor and a second inductor disposed on or above a major surface of a module substrate, a resin member, a metal shield layer covering a surface of the resin member, and a metal shield plate disposed on the major surface between the first inductor and the second inductor. The metal shield plate is in contact with a ground electrode of the major surface and the metal shield layer. The first inductor is disposed in any one of a transmitting path, a receiving path, and a transmitting and receiving path. The second inductor is disposed in any one of the transmitting path, the receiving path, and the transmitting and receiving path, other than the path in which the first inductor is disposed.

19 Claims, 20 Drawing Sheets

(51) Int. Cl.

| | |
|---|---|
| *H03F 3/24* | (2006.01) |
| *H03F 3/68* | (2006.01) |
| *H04B 1/40* | (2015.01) |

(52) U.S. Cl.

CPC .......... *H04B 1/40* (2013.01); *H03F 2200/111* (2013.01); *H03F 2200/165* (2013.01); *H03F 2200/171* (2013.01); *H03F 2200/294* (2013.01); *H03F 2200/451* (2013.01)

(58) Field of Classification Search

CPC ......... H03F 2200/165; H03F 2200/171; H03F 2200/294; H03F 2200/451; H04B 1/40; H04B 1/006; H01L 2924/19105; H01L 23/552; H01L 25/16; H01L 23/3121; H05K 1/006

USPC .......................................................... 455/73

See application file for complete search history.

(56) References Cited

U.S. PATENT DOCUMENTS

| | | | |
|---|---|---|---|
| 2006/0258050 | A1 | 11/2006 | Fujiwara et al. |
| 2012/0008288 | A1 | 1/2012 | Tsutamoto et al. |
| 2013/0043946 | A1 | 2/2013 | Hadjichristos et al. |
| 2018/0204781 | A1 | 7/2018 | Otsubo |
| 2020/0211998 | A1 | 7/2020 | Uejima et al. |

FOREIGN PATENT DOCUMENTS

| | | | |
|---|---|---|---|
| JP | 2012-019307 | A | 1/2012 |
| JP | 2014-522216 | A | 8/2014 |
| JP | 2020-108069 | A | 7/2020 |
| WO | 2005/099331 | A1 | 10/2005 |
| WO | 2017/047539 | A1 | 3/2017 |

* cited by examiner

1A (a)

(b)

1C (a)

91

70A

10

51

50

40

73

53

30

52

60

VII

VII

PAC

15

41

54

42

20

95

35

P

Q y
z ⊙ → x (b)

53 73 70A 30 52 95

92

91a

91

150 150 150g 150 150 150

91b z
y ⊗ → x

1G (a)

91

75a

75b

10

51

50

40

XI

XI

95

53

76b

76a

30

52

60

20

PAC

RADIO-FREQUENCY MODULE AND COMMUNICATION DEVICE

CROSS REFERENCE TO RELATED APPLICATION

This is a continuation-in-part of International Application No. PCT/JP2021/029447 filed on Aug. 6, 2021 which claims priority from Japanese Patent Application No. 2020-174127 filed on Oct. 15, 2020 and Japanese Patent Application No. 2020-136579 filed on Aug. 13, 2020. The contents of these applications are incorporated herein by reference in their entireties.

BACKGROUND OF THE DISCLOSURE

1. Field of the Disclosure

The present disclosure relates to a radio-frequency module and a communication device.

2. Description of the Related Art

In mobile communication equipment, such as cellular phones, particularly, with the progress of multi-bands, the arrangement of circuit elements that make up a radio-frequency front-end circuit is complicated.

Japanese Unexamined Patent Application Publication (Translation of PCT Application) No. 2014-522216 describes the circuit configuration of a transceiver (transmitting and receiving circuit) that includes a plurality of transmitters (transmitting paths), a plurality of receivers (receiving paths), and a switchplexer (antenna switch) disposed between an antenna and the plurality of transmitters and the plurality of receivers. Each of the plurality of transmitters includes a transmitting circuit, a transmitting power amplifier (PA), and an output circuit. Each of the plurality of receivers includes a receiving circuit, a receiving low noise amplifier (LNA), and an input circuit. The output circuit includes a transmitting filter, an impedance matching circuit, a duplexer, and the like. The input circuit includes a receiving filter, an impedance matching circuit, a duplexer, and the like. With the above configuration, simultaneous transmission, simultaneous reception, or simultaneous transmission and reception can be performed by the switching operation of the switchplexer.

BRIEF SUMMARY OF THE DISCLOSURE

However, when the transceiver (transmitting and receiving circuit) described in Japanese Unexamined Patent Application Publication (Translation of PCT Application) No. 2014-522216 is made up of a radio-frequency module mounted on mobile communication equipment, it is assumed that at least two of inductors respectively disposed in a transmitting path, a receiving path, and a transmitting and receiving path including an antenna switch are electromagnetically coupled to each other. In this case, a harmonic component of a high-power transmitting signal amplified by the transmitting power amplifier (PA) is superposed on a transmitting signal, with the result that the quality of the transmitting signal can decrease. The isolation between the transmission and the reception decreases due to the electromagnetic field coupling, and the harmonics or spurious waves, such as intermodulation distortion between a transmitting signal and another radio-frequency signal, flow into the receiving path, with the result that the receiving sensitivity may degrade.

The present disclosure is made to solve the above problem, and it is a possible benefit of the present disclosure to provide a radio-frequency module and a communication device in which the quality degradation of a transmitting signal or a receiving signal is suppressed.

A radio-frequency module according to an aspect of the present disclosure includes a module substrate having a major surface, a first inductor and a second inductor disposed on or above the major surface, a resin member covering at least part of the major surface, the first inductor, and the second inductor, a metal shield layer covering a surface of the resin member and set to a ground potential, and a first metal shield plate disposed on the major surface between the first inductor and the second inductor in a plan view of the module substrate. The first metal shield plate is in contact with a ground electrode of the major surface and the metal shield layer. The first inductor is disposed in any one of a transmitting path through which a transmitting signal is transmitted, a receiving path through which a receiving signal is transmitted, and a transmitting and receiving path through which a transmitting signal and a receiving signal are transmitted. The second inductor is disposed in any one of the transmitting path, the receiving path, and the transmitting and receiving path, other than the path in which the first inductor is disposed.

BRIEF DESCRIPTION OF THE SEVERAL VIEWS OF THE DRAWINGS

FIG. 12 is a circuit configuration diagram of a radio-frequency module and a communication device according to a third embodiment;

DETAILED DESCRIPTION OF THE DISCLOSURE

Figure 1:
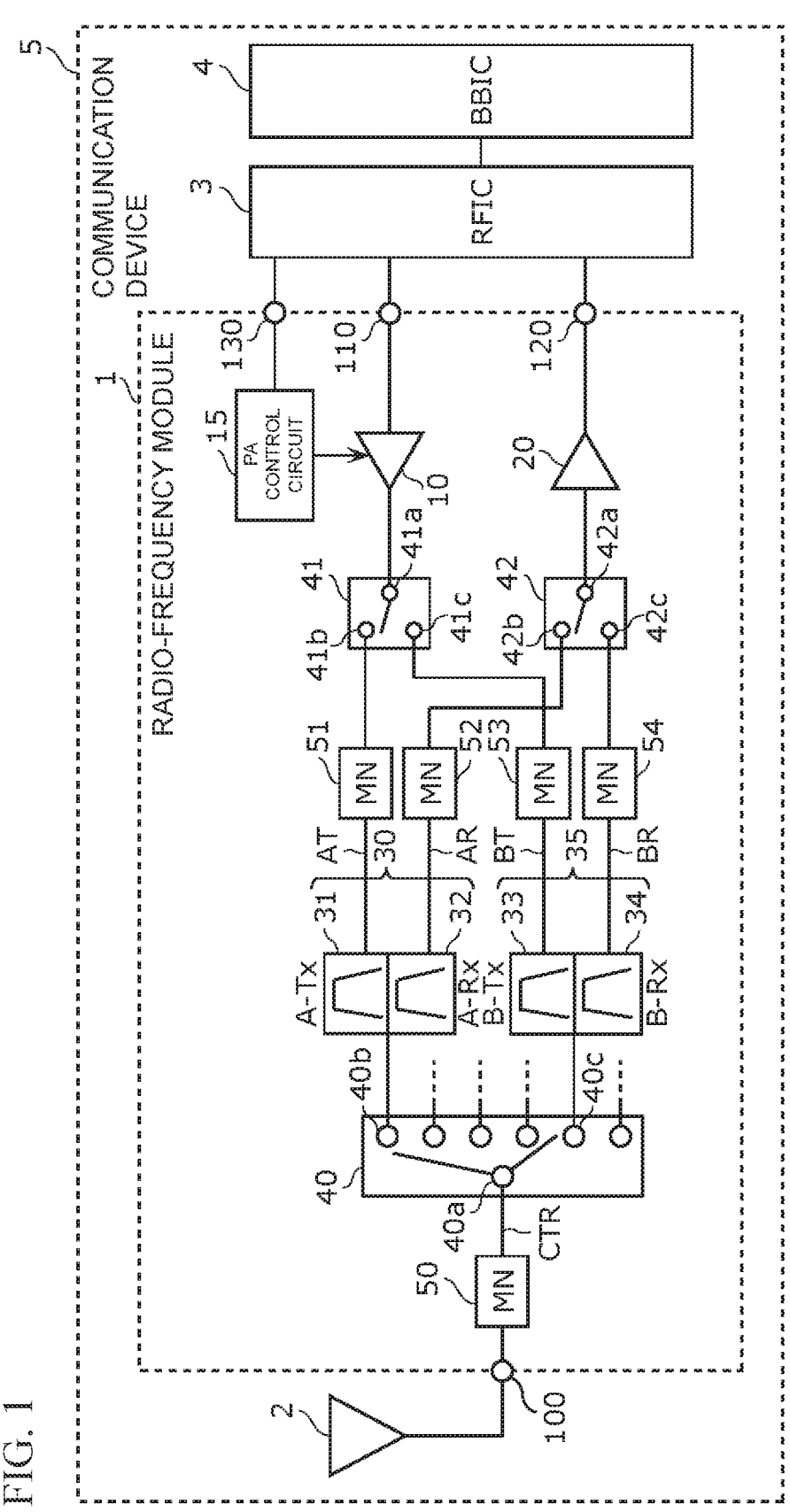
FIG. 1 is a circuit configuration diagram of a radio-frequency module and a communication device according to a first embodiment.

Hereinafter, embodiments of the present disclosure will be described in detail. The embodiments that will be described below are general or specific examples. Numeric values, shapes, materials, component elements, disposition and connection modes of the component elements, and the like, that will be described in the following embodiments and modifications are illustrative, and are not intended to limit the present disclosure. Of the component elements in the following embodiments and modifications, the component elements not included in the independent claims will be described as optional component elements. In addition, the size or size ratio of component elements shown in the drawings is not necessarily strict. In the drawings, like reference signs denote substantially identical components, and the overlap description may be omitted or simplified.

In the following description, terms representing the relationship between component elements, such as parallel and perpendicular, terms representing the shapes of component elements, such as rectangular, and numerical ranges do not represent only strict meanings and mean to allow differences of substantially equivalent ranges, for example, about several percent.

In the following drawings, an x-axis and a y-axis are axes orthogonal to each other in a plane parallel to a major surface of a module substrate. A z-axis is an axis perpendicular to the major surface of the module substrate, a positive direction of the z-axis is an upward direction, and a negative direction of the z-axis is a downward direction.

In a circuit configuration of the present disclosure, the phrase "connected" includes not only when directly connected with a connection terminal and/or a wiring conductor but also when electrically connected with another circuit component interposed therebetween. The phrase "connected between A and B" means connected to both A and B between A and B.

In a module configuration of the present disclosure, the word "plan view" means viewing a physical object by orthographically projecting the image of the physical object from a z-axis positive side onto an x-y plane. The phrase "a component is disposed on or above a major surface of a substrate" includes not only when the component is disposed on the major surface of the substrate in a state of being in contact with the major surface but also when the component is not in contact with the major surface and disposed above the major surface or when part of the component is disposed in the substrate from the major surface side. The phrase "A is disposed between B and C" means that at least one of a plurality of line segments connecting a selected point in B with a selected point in C passes through A. Terms representing the relationship between elements, such as "parallel" and "perpendicular", and terms representing the shapes of elements, such as "rectangular", do not represent only strict meanings and mean to allow errors of substantially equivalent ranges, for example, about several percent.

In the following description, the term "transmitting path" means a transmission line made up of a wire through which a radio-frequency transmitting signal is transmitted, an electrode directly connected to the wire, a terminal directly connected to the wire or the electrode, and the like. The term "receiving path" means a transmission line made up of a wire through which a radio-frequency receiving signal is transmitted, an electrode directly connected to the wire, a terminal directly connected to the wire or the electrode, and the like. The term "transmitting and receiving path" means a transmission line made up of a wire through which both a radio-frequency transmitting signal and a radio-frequency receiving signal are transmitted, an electrode directly connected to the wire, a terminal directly connected to the wire or the electrode, and the like.

In component arrangement of the present disclosure, the phrase "A is disposed adjacent to B" represents that A and B are disposed in proximity to each other and specifically means that there is no other circuit component in a space in which A faces B. In other words, the phrase "A is disposed adjacent to B" means that none of a plurality of line segments that goes from a selected point on a surface of A, facing B, to B along a direction normal to the surface passes through a circuit component other than A or B. Here, circuit components mean components including an active element and/or a passive element. In other words, circuit components include an active component, including a transistor, a diode, or the like, and a passive component, including an inductor, a transformer, a capacitor, or a resistance, and do not include an electromechanical component, including a terminal, a connector, a wire, or the like.

First Embodiment 1.1 Circuit Configuration of Radio-Frequency Module 1 and Communication Device 5

FIG. 1 is a circuit configuration diagram of a radio-frequency module 1 and a communication device 5 according to a first embodiment. As shown in the drawing, the communication device 5 includes the radio-frequency module 1, an antenna 2, an RF signal processing circuit (RFIC) 3, and a baseband signal processing circuit (BBIC) 4.

The RFIC 3 is an RF signal processing circuit that processes radio-frequency signals that are transmitted or received by the antenna 2. Specifically, the RFIC 3 processes a radio-frequency receiving signal inputted through a receiving signal path of the radio-frequency module 1 by down conversion or the like and outputs the processed and generated receiving signal to the BBIC 4. The RFIC 3 processes a transmitting signal inputted from the BBIC 4 by up conversion or the like and outputs the processed and generated radio-frequency transmitting signal to a transmitting signal path of the radio-frequency module 1.

The BBIC 4 is a circuit that performs signal processing by using an intermediate frequency band lower than that of a radio-frequency signal that propagates through the radio-frequency module 1. The signal processed by the BBIC 4 is used as, for example, an image signal for image display or used as a voice signal to call via a speaker.

The RFIC 3 also has the function of a control unit to control the connection of each of switches 40, 41, 42 of the radio-frequency module 1 in accordance with a communication band (frequency band) used. Specifically, the RFIC 3 switches the connection of each of the switches 40 to 42 of the radio-frequency module 1 in accordance with a control signal (not shown). Specifically, the RFIC 3 outputs a digital control signal for controlling the switches 40 to 42 to a PA control circuit 15. The PA control circuit 15 of the radio-frequency module 1 outputs a digital control signal to each of the switches 40 to 42 in accordance with a digital control signal inputted from the RFIC 3 to control the connection and disconnection of each of the switches 40 to 42.

The RFIC 3 also has the function of a control unit to control a gain of a power amplifier 10 of the radio-frequency module 1 and a power supply voltage Vcc and a bias voltage Vbias supplied to the power amplifier 10. Specifically, the RFIC 3 outputs a digital control signal to a control signal terminal 130 of the radio-frequency module 1. The PA control circuit 15 outputs a control signal, a power supply voltage Vcc, or a bias voltage Vbias to the power amplifier 10 in accordance with the digital control signal inputted via the control signal terminal 130 to adjust the gain of the power amplifier 10. The control unit may be provided outside the RFIC 3 or may be provided in, for example, the BBIC 4.

The antenna 2 is connected to an antenna connection terminal 100 of the radio-frequency module 1, radiates a radio-frequency signal outputted from the radio-frequency module 1, or receives a radio-frequency signal from outside and outputs the radio-frequency signal to the radio-frequency module 1.

In the communication device 5 according to the present embodiment, the antenna 2 and the BBIC 4 are not indispensable component elements.

Next, the detailed configuration of the radio-frequency module 1 will be described.

As shown in FIG. 1, the radio-frequency module 1 includes the power amplifier 10, a low noise amplifier 20, the PA control circuit 15, transmitting filters 31, 33, receiving filters 32, 34, matching circuits 50, 51, 52, 53, 54, the switches 40, 41, 42, the antenna connection terminal 100, a transmitting input terminal 110, a receiving output terminal 120, and the control signal terminal 130.

The antenna connection terminal 100 is connected to the antenna 2. The transmitting input terminal 110 is a terminal for receiving a transmitting signal from outside the radio-frequency module 1 (RFIC 3). The receiving output terminal 120 is a terminal for supplying a receiving signal to outside the radio-frequency module 1 (RFIC 3).

The power amplifier 10 is a transmitting amplifier that amplifies a transmitting signal in a communication band A and a communication band B. An input terminal of the power amplifier 10 is connected to the transmitting input terminal 110. An output terminal of the power amplifier 10 is connected to the matching circuits 51, 53 with the switch 41 interposed therebetween.

The low noise amplifier 20 is a receiving amplifier that amplifies a receiving signal in the communication band A and the communication band B with low noise. An input terminal of the low noise amplifier 20 is connected to the matching circuits 52, 54 with the switch 42 interposed therebetween. An output terminal of the low noise amplifier 20 is connected to the receiving output terminal 120.

The PA control circuit 15 adjusts the gain of the power amplifier 10 in accordance with a digital control signal MIPI or the like, inputted via the control signal terminal 130. The PA control circuit 15 may be made up of a semiconductor integrated circuit (integrated circuit). The semiconductor IC is made up of, for example, a complementary metal oxide semiconductor (CMOS). Specifically, the semiconductor IC is formed by silicon on insulator (SOI) process. Thus, a semiconductor IC can be manufactured at low cost. A semiconductor IC may be made of at least any one of GaAs, SiGe, and GaN. Thus, a semiconductor IC can output a radio-frequency signal having high-quality amplification performance and noise performance.

The transmitting filter 31 is disposed in a transmitting path AT connecting the power amplifier 10 with the switch 40 and passes a transmitting signal in a transmitting band of the communication band A, of the transmitting signal amplified by the power amplifier 10. The transmitting filter 33 is disposed in a transmitting path BT connecting the power amplifier 10 with the switch 40 and passes a transmitting signal in a transmitting band of the communication band B, of the transmitting signal amplified by the power amplifier 10.

The receiving filter 32 is disposed in a receiving path AR connecting the low noise amplifier 20 with the switch 40 and passes a receiving signal in a receiving band of the communication band A, of the receiving signal inputted from the antenna connection terminal 100. The receiving filter 34 is disposed in a receiving path BR connecting the low noise amplifier 20 with the switch 40 and passes a receiving signal in a receiving band of the communication band B, of the receiving signal inputted from the antenna connection terminal 100.

Each of the transmitting filters 31, 33 and the receiving filters 32, 34 may be, for example, any one of a surface acoustic wave filter, an acoustic wave filter using bulk acoustic waves (BAW), an LC resonant filter, and a dielectric filter and is not limited to these filters.

The transmitting filter 31 and the receiving filter 32 make up a duplexer 30 that uses the communication band A as a pass band. The transmitting filter 33 and the receiving filter 34 make up a duplexer 35 that uses the communication band B as a pass band.

Each of the duplexers 30, 35 may be a single filter that performs transmission in the time division duplex (TDD) mode. In this case, a switch for switching between the transmission and the reception is disposed on at least one of an upstream side and a downstream side of the single filter.

The matching circuit 50 is disposed in a transmitting and receiving path CTR connecting the antenna connection terminal 100 with the switch 40 performs the impedance matching between the antenna 2 and each of the switch 40, and the duplexers 30, 35. The matching circuit 50 has at least one inductor. The matching circuit 50 may be disposed in series with the transmitting and receiving path CTR or may be connected between the transmitting and receiving path CTR and a ground.

The matching circuit 51 is disposed in the transmitting path AT connecting the power amplifier 10 with the transmitting filter 31 and performs the impedance matching between the power amplifier 10 and the transmitting filter 31. The matching circuit 51 has at least one inductor. The matching circuit 51 may be disposed in series with the transmitting path AT or may be connected between the transmitting path AT and the ground.

The matching circuit 53 is disposed in the transmitting path BT connecting the power amplifier 10 with the transmitting filter 33 and performs the impedance matching between the power amplifier 10 and the transmitting filter 33. The matching circuit 53 has at least one inductor. The matching circuit 53 may be disposed in series with the transmitting path BT or may be connected between the transmitting path BT and the ground.

The matching circuit 52 is disposed in the receiving path AR connecting the low noise amplifier 20 with the receiving filter 32 and performs the impedance matching between the low noise amplifier 20 and the receiving filter 32. The matching circuit 52 has at least one inductor. The matching circuit 52 may be disposed in series with the receiving path AR or may be connected between the receiving path AR and the ground.

The matching circuit 54 is disposed in the receiving path BR connecting the low noise amplifier 20 with the receiving filter 34 and performs the impedance matching between the low noise amplifier 20 and the receiving filter 34. The matching circuit 54 has at least one inductor. The matching circuit 54 may be disposed in series with the receiving path BR or may be connected between the receiving path BR and the ground.

Instead of the matching circuits 51, 53 or in addition to the matching circuits 51, 53, a matching circuit may be disposed in a transmitting path between the power amplifier 10 and the switch 41.

The switch 40 has a common terminal 40a and selection terminals 40b, 40c. The common terminal 40a is connected to the antenna connection terminal 100 with the matching circuit 50 interposed therebetween. The selection terminal 40b is connected to the duplexer 30. The selection terminal 40c is connected to the duplexer 35. In other words, the switch 40 is an antenna switch disposed between the antenna connection terminal 100 and the duplexers 30, 35. The switch 40 (1) switches between the connection and disconnection of the antenna connection terminal 100 with the duplexer 30 and (2) switches between the connection and disconnection of the antenna connection terminal 100 with the duplexer 35. The switch 40 is made up of a multi-connection switch circuit capable of simultaneously performing the connection of the above (1) and (2).

Instead of the matching circuits 52, 54 or in addition to the matching circuits 52, 54, a matching circuit may be disposed in a receiving path between the low noise amplifier 20 and the switch 42.

Instead of the matching circuit 50 or in addition to the matching circuit 50, a matching circuit may be disposed in a transmitting and receiving path connecting the switch 40 with the duplexer 30 and a transmitting and receiving path connecting the switch 40 with the duplexer 35.

The switch 41 has a common terminal 41a and selection terminals 41b, 41c. The switch 41 is disposed in a transmitting path connecting the power amplifier 10 with the transmitting filters 31, 33. The switch 41 switches between the connection of the power amplifier 10 with the transmitting filter 31 and the connection of the power amplifier 10 with the transmitting filter 33. The switch 41 is made up of, for example, a single pole double throw (SPDT) switch circuit in which the common terminal 41a is connected to the output terminal of the power amplifier 10, the selection terminal 41b is connected to the transmitting filter 31 with the matching circuit 51 interposed therebetween, and the selection terminal 41c is connected to the transmitting filter 33 with the matching circuit 53 interposed therebetween.

The switch 42 has a common terminal 42a and selection terminals 42b, 42c. The switch 42 is disposed in a receiving path connecting the low noise amplifier 20 with the receiving filter 32, 34. The switch 42 switches between the connection of the low noise amplifier 20 with the receiving filter 32 and the connection of the low noise amplifier 20 with the receiving filter 34. The switch 42 is made up of, for example, an SPDT switch circuit in which the common terminal 42a is connected to the input terminal of the low noise amplifier 20, the selection terminal 42b is connected to the receiving filter 32 with the matching circuit 52 interposed therebetween, and the selection terminal 42c is connected to the receiving filter 34 with the matching circuit 54 interposed therebetween.

The transmitting path AT is a signal path that transmits a transmitting signal in the communication band A and that connects the transmitting input terminal 110 with the common terminal 40a of the switch 40. The transmitting path BT is a signal path that transmits a transmitting signal in the communication band B and that connects the transmitting input terminal 110 with the common terminal 40a of the switch 40. The receiving path AR is a signal path that transmits a receiving signal in the communication band A and that connects the receiving output terminal 120 with the common terminal 40a of the switch 40. The receiving path BR is a signal path that transmits a receiving signal in the communication band B and that connects the receiving output terminal 120 with the common terminal 40a of the switch 40. The transmitting and receiving path CTR is a signal path that transmits a transmitting signal and a receiving signal in the communication band A and a transmitting signal and a receiving signal in the communication band B and that connects the antenna connection terminal 100 with the common terminal 40a of the switch 40.

In the radio-frequency module 1 having the above circuit configuration, the power amplifier 10, the switch 41, the matching circuit 51, and the transmitting filter 31 make up a first transmitting circuit that outputs a transmitting signal in the communication band A toward the antenna connection terminal 100. The power amplifier 10, the switch 41, the matching circuit 53, and the transmitting filter 33 make up a second transmitting circuit that outputs a transmitting signal in the communication band B toward the antenna connection terminal 100.

The low noise amplifier 20, the switch 42, the matching circuit 52, and the receiving filter 32 make up a first receiving circuit that outputs a receiving signal in the communication band A from the antenna 2 via the antenna connection terminal 100. The low noise amplifier 20, the switch 42, the matching circuit 54, and the receiving filter 34 make up a second receiving circuit that outputs a receiving signal in the communication band B from the antenna 2 via the antenna connection terminal 100.

With the above circuit configuration, the radio-frequency module 1 according to the present embodiment is capable of performing at least any one of (1) transmission and reception of a radio-frequency signal in the communication band A, (2) transmission and reception of a radio-frequency signal in the communication band B, and (3) simultaneous transmission, simultaneous reception, or simultaneous transmission and reception of a radio-frequency signal in the communication band A and a radio-frequency signal in the communication band B.

In the radio-frequency module according to the present embodiment, a transmitting circuit and a receiving circuit do not need to be connected to the antenna connection terminal 100 with the switch 40 interposed therebetween, and the transmitting circuit and the receiving circuit may be connected to the antenna 2 with respective different terminals interposed therebetween. The radio-frequency module according to the present embodiment just needs to include at least two of a transmitting path, a receiving path, and a transmitting and receiving path, and matching circuits respectively disposed in the two paths as a circuit configuration. The radio-frequency module just needs to include any one of the first transmitting circuit and the second transmitting circuit. The radio-frequency module just needs to include any one of the first receiving circuit and the second receiving circuit.

Here, in the radio-frequency module 1 having the above circuit configuration, when at least two of the matching circuits respectively disposed in the transmitting path, the receiving path, and the transmitting and receiving path are electromagnetically coupled to each other, a harmonic component of high-power transmitting signal amplified by the power amplifier is superposed on a transmitting signal, with the result that the quality of the transmitting signal may decrease. The isolation between the transmission and the reception decreases due to the electromagnetic field coupling, and the harmonics or spurious waves, such as intermodulation distortion between a transmitting signal and another radio-frequency signal, flow into the receiving path, with the result that the receiving sensitivity may degrade.

In contrast, the radio-frequency module 1 according to the present embodiment has a configuration to suppress the electromagnetic field coupling. Hereinafter, the configuration of the radio-frequency module 1 according to the present embodiment to suppress the electromagnetic field coupling will be described.

Figure 2A:
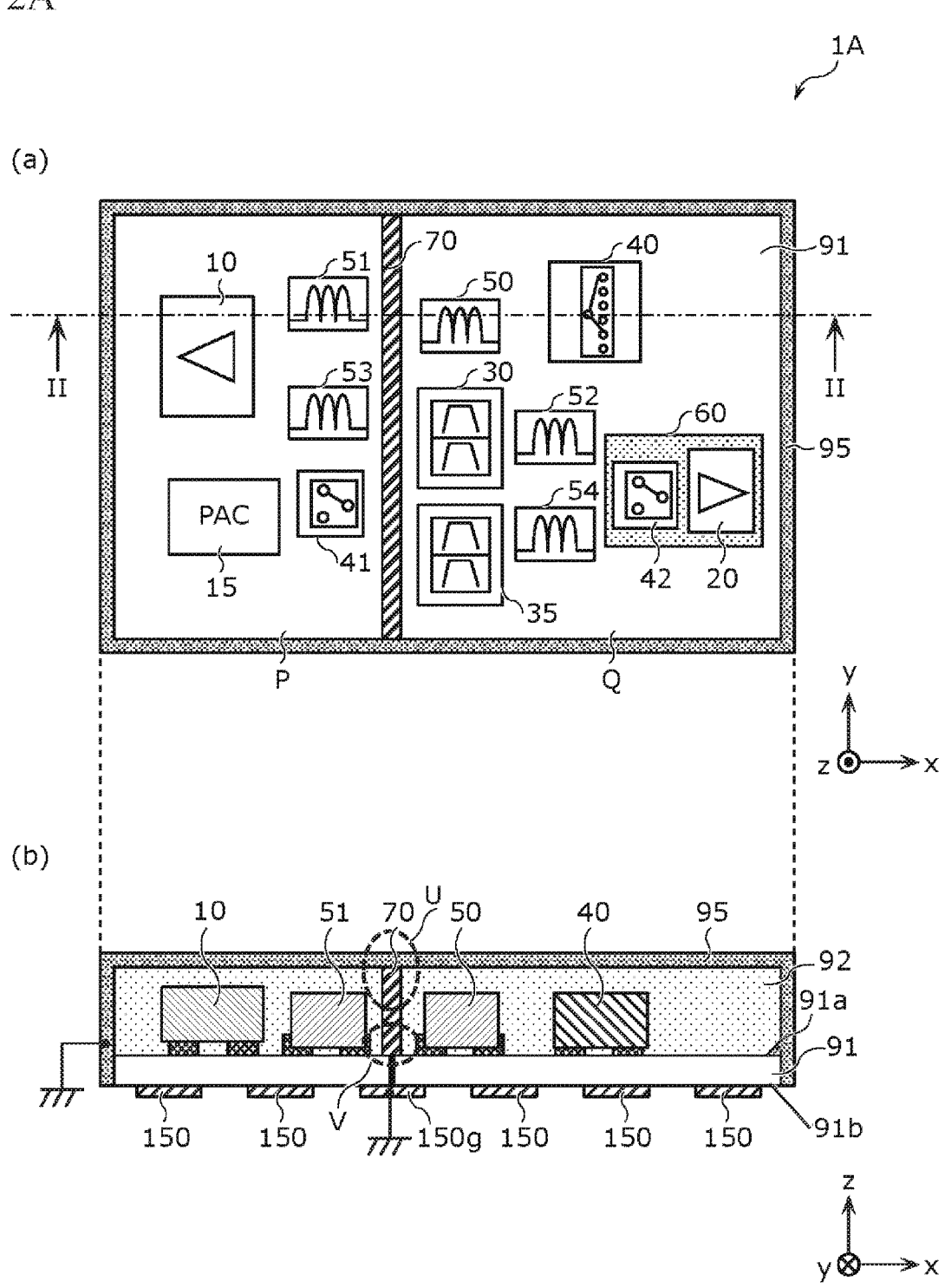
FIG. 2A shows a plan view and a cross-sectional view of the radio-frequency module according to the first embodiment.

1.2 Arrangement of Circuit Components of Radio-Frequency Module 1A According to First Embodiment FIG. 2A shows a plan view and a cross-sectional view of a radio-frequency module 1A according to the first embodiment. In FIG. 2A, (a) is an arrangement view of circuit components when a major surface 91a of a module substrate 91 is viewed from the positive side of the z-axis. In FIG. 2A, (b) is a cross-sectional view taken along the line II-II in (a) of FIG. 2A. The radio-frequency module 1A specifically shows the arrangement of the circuit components that make up the radio-frequency module 1 according to the embodiment.

As shown in FIG. 2A, the radio-frequency module 1A according to the present embodiment further includes the module substrate 91, a metal shield plate 70, a metal shield layer 95, a resin member 92, and external connection terminals 150 in addition to the circuit configuration shown in FIG. 1.

The module substrate 91 is a substrate on the major surface 91a of which the first and second transmitting circuits and the first and second receiving circuits are mounted. Examples of the module substrate 91 include a low temperature co-fired ceramics (LTCC) substrate having a multilayer structure of a plurality of dielectric layers, a high temperature co-fired ceramics (HTCC) substrate, a component built-in substrate, a substrate having a redistribution layer (RDL), and a printed circuit board. The antenna connection terminal 100, the transmitting input terminal 110, the receiving output terminal 120, and the control signal terminal 130 may be formed on the module substrate 91.

The resin member 92 is disposed on or above the major surface 91a of the module substrate 91 and covers at least part of circuit components that make up the first and second transmitting circuits and the first and second receiving circuits and the major surface 91a of the module substrate 91. The resin member 92 has a function to ensure the reliability, such as the mechanical strength and moisture resistance, of the circuit components. The resin member 92 is not an indispensable component element for the radio-frequency module according to the present embodiment.

The external connection terminals 150 are disposed on the major surface 91b of the module substrate 91. The radio-frequency module 1A exchanges an electrical signal via the plurality of external connection terminals 150 with an external substrate disposed in the negative direction of the z-axis to the radio-frequency module 1A. A ground terminal 150g of the plurality of external connection terminals 150 is set to a ground potential of the external substrate. As shown in FIG. 2A, the external connection terminals 150 may be planar electrodes formed on the major surface 91b or may be bump electrodes formed on the major surface 91b.

The metal shield layer 95 covers the surface of the resin member 92 and is set to a ground potential. The metal shield layer 95 is, for example, a metal thin film formed by sputtering.

The metal shield plate 70 is an example of a first metal shield plate. The metal shield plate 70 is a metal wall upright from the major surface 91a toward a top surface, in the positive direction of the z-axis, of the resin member 92. The metal shield plate 70 is in contact with a ground electrode of the major surface 91a and the metal shield layer 95. In other words, the metal shield plate 70 is connected to the ground at least at two portions, that is, upper and lower portions, of the metal shield plate 70, so an electromagnetic field shielding function is enhanced. The metal shield plate 70 may be in contact with a shield surface that is in contact with the top surface of the resin member 92, of a shield surface that makes up the ground electrode of the major surface 91a and the metal shield layer 95, or may be in contact with a shield surface that is in contact with a side surface of the resin member 92, of a shield surface that makes up the ground electrode of the major surface 91a and the metal shield layer 95. The detailed structure of the metal shield plate 70 will be described later with reference to FIGS. 3A to 3C.

The metal shield plate 70 partitions the major surface 91a into a region P and a region Q. As shown in (a) of FIG. 2A, the power amplifier 10, the PA control circuit 15, the matching circuits 51, 53, and the switch 41 are disposed in the region P of the major surface 91a. The low noise amplifier 20, the duplexers 30, 35, the matching circuits 50, 52, 54, and the switches 40, 42 are disposed in the region Q of the major surface 91a.

Although not shown in FIG. 2A, wires that make up the transmitting paths AT, BT, the receiving paths AR, BR, and the transmitting and receiving path CTR, shown in FIG. 1, are formed inside the module substrate 91 and on the major surfaces 91a, 91b. The wires may be bonding wires both ends of each of which are joined with any one of the major surfaces 91a, 91b, and the circuit components that make up the radio-frequency module 1A, or may be terminals, electrodes, or wires formed on the surfaces of the circuit components that make up the radio-frequency module 1A.

In the present embodiment, the matching circuit 50 is disposed in the transmitting and receiving path CTR connecting the antenna connection terminal 100 with the common terminal 40a of the switch 40 and includes a first inductor. On the other hand, the matching circuit 51 is disposed in the transmitting path AT connecting the transmitting input terminal 110 with the common terminal 40a of the switch 40 and includes a second inductor.

Here, as shown in FIG. 2A, the metal shield plate 70 is disposed on the major surface 91a between the first inductor of the matching circuit 50 and the second inductor of the matching circuit 51 in a plan view of the module substrate 91.

With this configuration, the second inductor disposed in the transmitting path AT and the first inductor disposed in the transmitting and receiving path CTR are disposed so as to sandwich the metal shield plate 70 set to the ground potential, so electromagnetic field coupling of the first inductor with the second inductor is suppressed. Thus, a decrease in the quality of a transmitting signal resulting from the output of a high-power transmitting signal amplified by the power amplifier 10 and on which a harmonic component is superposed from the antenna connection terminal 100 without passing through the transmitting filter 31 is suppressed. Degradation of receiving sensitivity resulting from flow of the harmonics or spurious waves, such as intermodulation distortion between a transmitting signal and another radio-frequency signal, into the receiving path AR or the receiving path BR due to the electromagnetic field coupling is suppressed.

A combination of the first inductor with the second inductor disposed so as to be isolated by the metal shield plate 70 is not limited to a combination of the inductor disposed in the transmitting and receiving path with the inductor disposed in the transmitting path.

A combination of the first inductor with the second inductor may be a combination of the inductor disposed in the transmitting and receiving path with the inductor disposed in the receiving path. With this configuration, degradation of receiving sensitivity resulting from flow of a high-power transmitting signal amplified by the power amplifier 10 and its harmonic component into the receiving path AR or the receiving path BR without passing through the receiving filter 32 or the receiving filter 34 is suppressed.

Alternatively, a combination of the first inductor with the second inductor may be a combination of the inductor disposed in the transmitting path with the inductor disposed in the receiving path. With this configuration, degradation of receiving sensitivity resulting from flow of a high-power transmitting signal amplified by the power amplifier 10 and its harmonic component into the receiving path AR or the receiving path BR without passing through the transmitting filter 31 or the transmitting filter 33 or the receiving filter 32 or the receiving filter 34 is suppressed.

In other words, the first inductor just needs to be disposed in any one of the transmitting path, the receiving path, and the transmitting and receiving path, and the second inductor just needs to be disposed in any one of the transmitting path, the receiving path, and the transmitting and receiving path, other than the path in which the first inductor is disposed.

In the radio-frequency module 1A according to the present embodiment, the circuit components disposed in the transmitting paths AT, BT (the power amplifier 10, the PA control circuit 15, the matching circuits 51, 53, and the switch 41) are disposed in the region P of the major surface 91a, and the circuit components disposed in the receiving paths AR, BR (the low noise amplifier 20, the matching circuits 52, 54, and the switch 42) are disposed in the region Q of the major surface 91a. In other words, the circuit components disposed in the transmitting paths and the circuit components disposed in the receiving paths are disposed so as to be isolated by the metal shield plate 70. With this configuration, the isolation between the transmission and the reception is improved.

In the radio-frequency module 1A according to the present embodiment, the low noise amplifier 20 and the switch 42 may be included in a single semiconductor IC 60. Thus, the radio-frequency module 1A has a low profile, with the result that a footprint of components on the major surface 91a is reduced. Thus, the size of the radio-frequency module 1A is reduced. In addition, the semiconductor IC 60 may include at least one of the switches 40, 41.

Figure 2B:
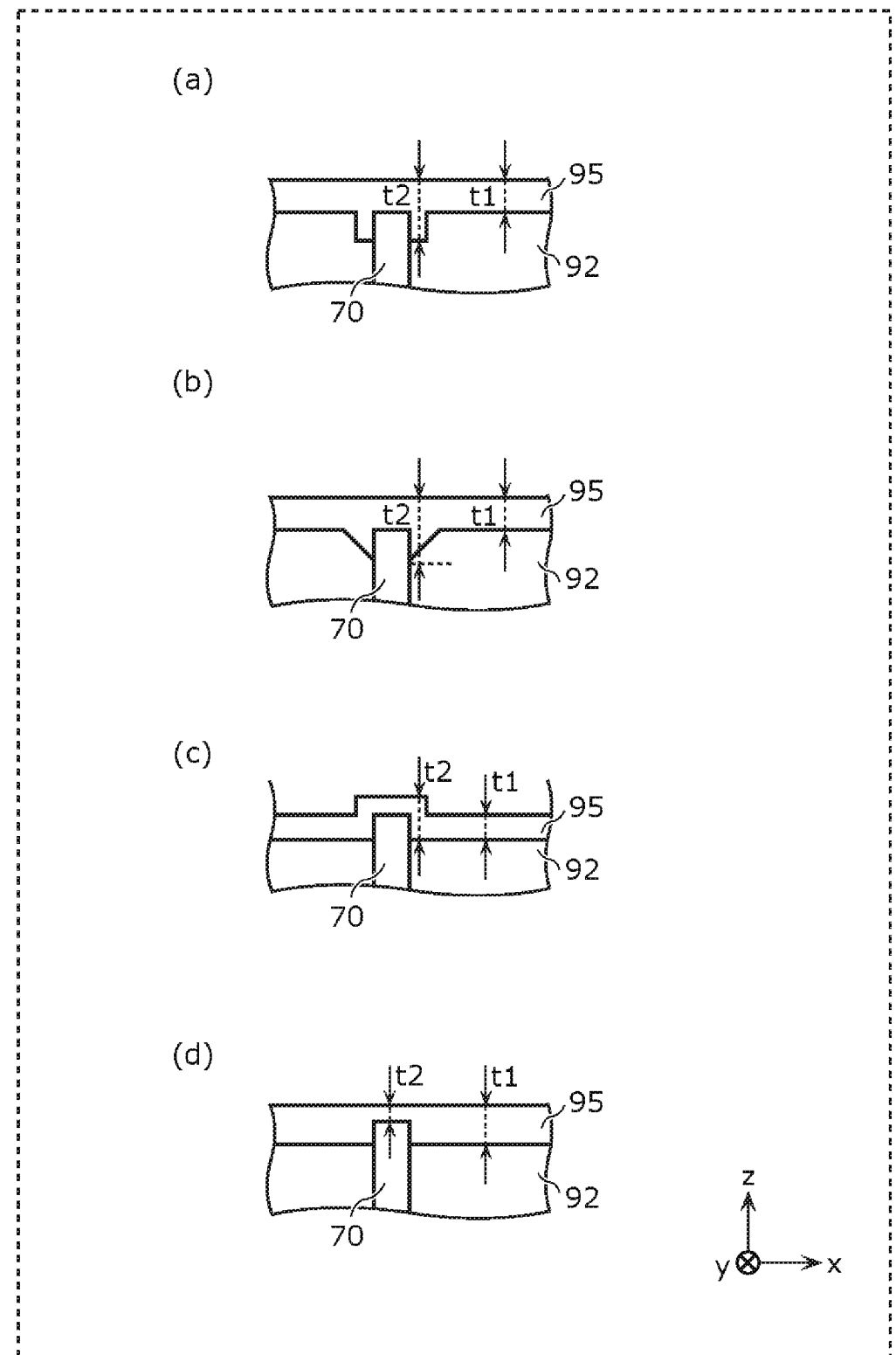
FIG. 2B is a cross-sectional view of a joining portion between a metal shield plate and a metal shield layer according to the first embodiment.

FIG. 2B is a cross-sectional view of a joining portion between the metal shield plate 70 and the metal shield layer 95 according to the first embodiment. In FIG. 2B, (a) to (d) respectively show examples of a cross-sectional structure in the joining portion (a region U in (b) of FIG. 2A) between the metal shield plate 70 and the metal shield layer 95.

As shown in (a) of FIG. 2B, in a first example, the thickness (t2) of a first part of the metal shield layer 95 in proximity to the metal shield plate 70 in a direction (x-axis direction) parallel to the metal shield layer 95 is greater than the thickness (t1) of a second part of the metal shield layer 95 farther from the metal shield plate 70 than the first part.

With this configuration, when the thickness t1 is less than the thickness t2, the area of contact between the metal shield plate 70 and the metal shield layer 95 is increased. Thus, the electrical continuity between the metal shield plate 70 and the metal shield layer 95 is improved, and the potentials of both are stable, so a shielding effect is improved. Since the metal shield layer 95 is connected to the ground of the module substrate 90 with the metal shield plate 70 interposed therebetween, the heat dissipation of the heat generated from the power amplifier 10 is improved.

Alternatively, as shown in (b) of FIG. 2B, in a second example, the thickness (t2) of a first part of the metal shield layer 95 in proximity to the metal shield plate 70 in a direction (x-axis direction) parallel to the metal shield layer 95 is greater than the thickness (t1) of a second part of the metal shield layer 95 farther from the metal shield plate 70 than the first part.

With this configuration, similar advantageous effects to the advantageous effects of the first example are obtained.

Alternatively, as shown in (c) of FIG. 2B, in a third example, the thickness (t2) of a first part of the metal shield layer 95 in proximity to the metal shield plate 70 in a direction (x-axis direction) parallel to the metal shield layer 95 is greater than the thickness (t1) of a second part of the metal shield layer 95 farther from the metal shield plate 70 than the first part.

With this configuration, similar advantageous effects to the advantageous effects of the first example are obtained.

Alternatively, as shown in (d) of FIG. 2B, in a fourth example, the thickness (t2) of a third part of the metal shield layer 95 in proximity to the metal shield plate 70 in a direction normal to the metal shield layer 95 is less than the thickness (t1) of a fourth part of the metal shield layer 95 farther from the metal shield plate 70 than the third part.

With this configuration, since the side surface of a distal end portion of the metal shield plate 70 is in contact with the metal shield layer 95, the area of contact between the metal shield plate 70 and the metal shield layer 95 is increased. Thus, the electrical continuity between the metal shield plate 70 and the metal shield layer 95 is improved, and the potentials of both are stable, so a shielding effect is improved. Since the metal shield layer 95 is connected to the ground of the module substrate 90 with the metal shield plate 70 interposed therebetween, the heat dissipation of the heat generated from the power amplifier 10 is improved.

1.3 Structure of Metal Shield Plate

Next, the structure of the metal shield plate 70 of the radio-frequency module 1A according to the present embodiment will be described.

Figure 3A:
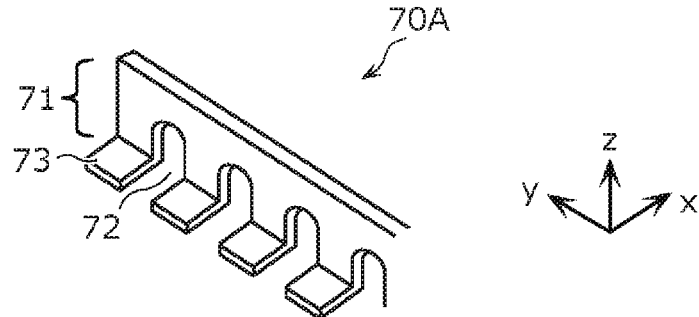
FIG. 3A is an exterior perspective view that shows a first example of the metal shield plate.

FIG. 3A is an exterior perspective view of a metal shield plate 70A. The metal shield plate 70A shown in the drawing is an example of the metal shield plate 70 according to the embodiment. The metal shield plate 70A is upright from the major surface 91*a* (not shown) toward the top surface of the resin member 92 (not shown) (in the z-axis direction). Holes 72 extending through the metal shield plate 70A in the direction normal to the metal shield plate 70A (x-axis direction) are formed between the metal shield plate 70A and the major surface 91*a*.

The metal shield plate 70A has a main body portion 71 upright from the major surface 91*a* toward the top surface of the resin member 92 (in the z-axis direction) and joining portions 73 extended parallel to the major surface 91*a* on the major surface 91*a* side and joined with the ground electrode (not shown) of the major surface 91*a*.

With the structure of the metal shield plate 70A, since the holes 72 are formed between the main body portion 71 and the major surface 91*a*, good flowability of liquid resin is ensured near the metal shield plate 70A in the process of forming the resin member 92 on the major surface 91*a*. Thus, generation of voids or the like where the resin member 92 is not formed near the metal shield plate 70A is suppressed.

Figure 3B:
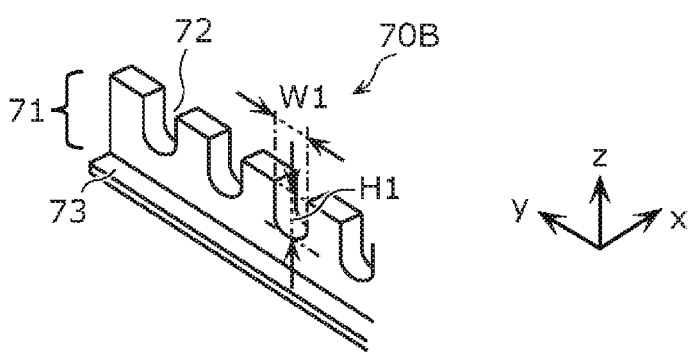
FIG. 3B is an exterior perspective view that shows a second example of the metal shield plate.

FIG. 3B is an exterior perspective view of a metal shield plate 70B. The metal shield plate 70B shown in the drawing is an example of the metal shield plate 70 according to the embodiment. The metal shield plate 70B is upright from the major surface 91*a* (not shown) toward the top surface of the resin member 92 (not shown) (in the z-axis direction). Holes 72 extending through the metal shield plate 70B in the direction normal to the metal shield plate 70B (x-axis direction) are formed between the metal shield plate 70B and the top surface of the resin member 92.

The metal shield plate 70B has a main body portion 71 upright from the major surface 91*a* toward the top surface of the resin member 92 (in the z-axis direction), and a joining portion 73 extended parallel to the major surface 91*a* on the major surface 91*a* side and joined with the ground electrode (not shown) of the major surface 91*a*.

With the structure of the metal shield plate 70B, since the holes 72 are formed between the main body portion 71 and the top surface, good flowability of liquid resin is ensured near the metal shield plate 70B in the process of forming the resin member 92 on the major surface 91*a*. Thus, generation of voids or the like where the resin member 92 is not formed near the metal shield plate 70B is suppressed. In addition, since the hole 72 is not formed in a region that is in contact with the major surface 91*a* (a lower region of the main body portion 71), the isolation between circuit components disposed on the major surface 91*a* with the metal shield plate 70B interposed therebetween is improved.

Here, the holes 72 surrounded by the main body portion 71 and the metal shield layer 95 may be regarded as small waveguides. In other words, when a minimum frequency of radio-frequency signals that can pass through the holes 72 is a frequency at which a larger one of the width W1 and the height H1 of the hole 72 is $\Delta/2$ ($\Delta$ is the wave length of the radio-frequency signal), the radio-frequency signal can pass as a lowest-order mode (TE01 or TE10).

With this configuration, when a larger one of the width W1 and the height H1 of the hole 72 is set to less than or equal to $\Delta/2$ of the lowest frequency of radio-frequency signals that pass through the radio-frequency module 1A, the holes 72 are configured such that a radio-frequency signal in a frequency band used by the radio-frequency module 1A does not pass through the holes 72, so a good shielding effect is obtained.

Figure 3C:
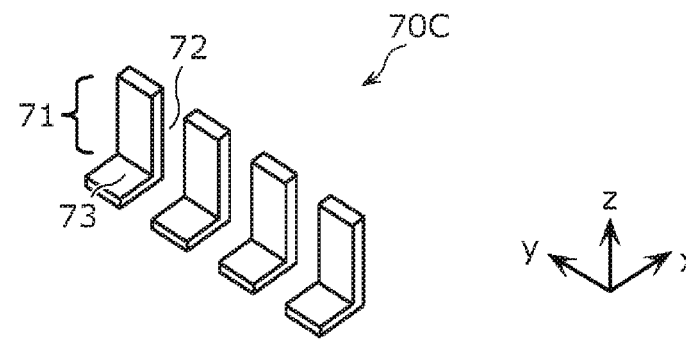
FIG. 3C is an exterior perspective view that shows a third example of the metal shield plate.

FIG. 3C is an exterior perspective view of a metal shield plate 70C. The metal shield plate 70C shown in the drawing is an example of the metal shield plate 70 according to the embodiment. The metal shield plate 70C is upright from the major surface 91*a* (not shown) toward the top surface of the resin member 92 (not shown) (in the z-axis direction). Holes 72 extending through the metal shield plate 70C in the direction normal to the metal shield plate 70C (x-axis direction) are formed between the major surface 91*a* and the top surface of the resin member 92.

The metal shield plate 70C has main body portions 71 upright from the major surface 91*a* toward the top surface of the resin member 92 (in the z-axis direction) and joining portions 73 extended parallel to the major surface 91*a* on the major surface 91*a* side and joined with the ground electrode (not shown) of the major surface 91*a*. In the metal shield plate 70C, the plurality of main body portions 71 is discretely disposed with the hole 72 interposed therebetween, and the plurality of joining portions 73 is discretely disposed with the hole 72 interposed therebetween.

With the structure of the metal shield plate 70C, since the holes 72 are formed between the major surface 91*a* and the top surface, good flowability of liquid resin is ensured near the metal shield plate 70C in the process of forming the resin member 92 on the major surface 91*a*. Thus, generation of voids or the like where the resin member 92 is not formed near the metal shield plate 70C is suppressed.

An example of the structure of the metal shield plate 70 is not limited to the metal shield plates 70A to 70C. For example, a plurality of holes 72 may be disposed from the major surface 91*a* toward the top surface. A direction in which the joining portion 73 is extended is not limited to a negative direction of the x-axis as shown in FIGS. 3A to 3C, and may be a positive direction of the x-axis. Furthermore, the metal shield plate 70 may include both the joining portions 73 extended in the negative direction of the x-axis and the joining portions 73 extended in the positive direction of the x-axis.

1.4 Arrangement of Metal Shield Plate, First Inductor, and Second Inductor

Next, the arrangement relation between the metal shield plate 70 and the inductors of the matching circuits in the radio-frequency module 1A according to the present embodiment will be described.

Figure 4A:
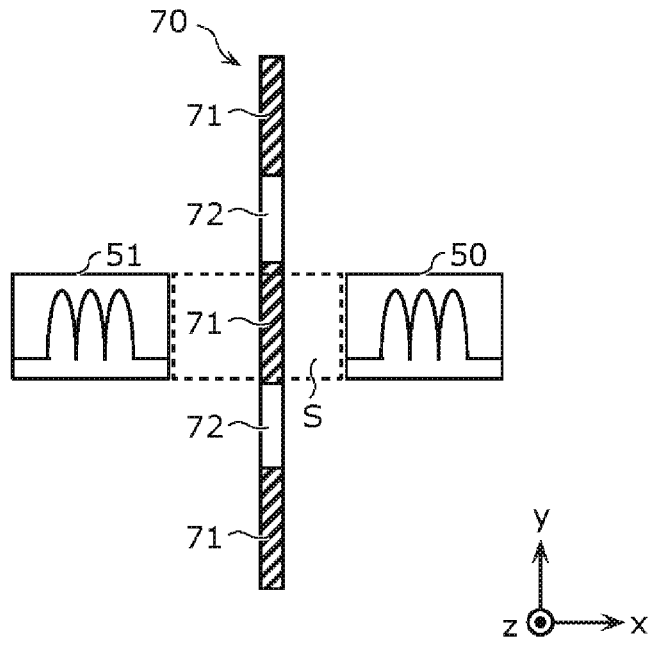
FIG. 4A is a view that shows a first example of an arrangement relation between the metal shield plate and two inductors.

FIG. 4A is a view that shows a first example of the arrangement relation between the metal shield plate 70 and the two inductors. The arrangement relation between the metal shield plate 70 and each of the first inductor of the matching circuit 50 and the second inductor of the matching circuit 51 is shown in the drawing. As shown in the drawing, in a plan view of the module substrate 91, the main body portion 71 of the metal shield plate 70, sandwiched by the adjacent holes 72, is disposed in a region S in which the first inductor and the second inductor face each other.

With this configuration, of an electromagnetic field formed by the first inductor and the second inductor, a high-intensity electromagnetic field is blocked by the main body portion 71. Thus, electromagnetic field coupling of the first inductor with the second inductor is effectively suppressed.

Figure 4B:
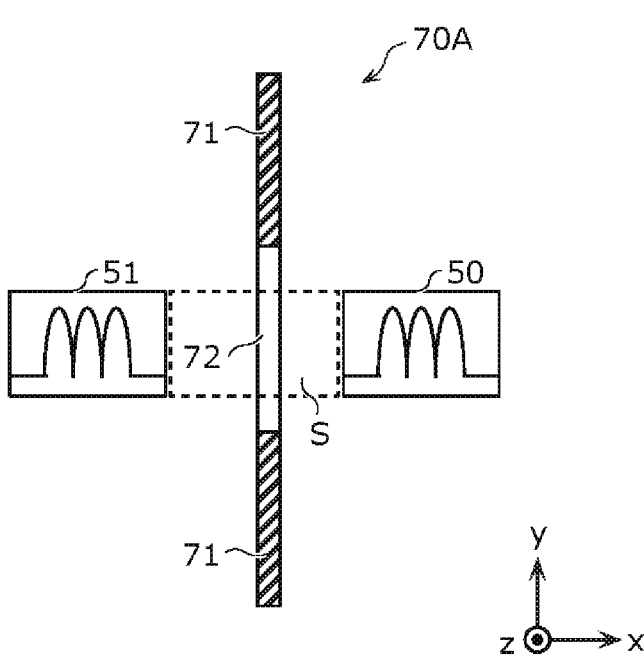
FIG. 4B is a view that shows a second example of an arrangement relation between the metal shield plate and two inductors.

FIG. 4B is a view that shows a second example of the arrangement relation between the metal shield plate 70A and the two inductors. The arrangement relation between the metal shield plate 70A and each of the first inductor of the matching circuit 50 and the second inductor of the matching circuit 51 is shown in the drawing. As shown in the drawing, in a plan view of the module substrate 91, the hole 72 is disposed in the region S in which the first inductor and the second inductor face each other. Although not shown in the drawing, the main body portion 71 is disposed on the upper side (in the positive direction of the z-axis) of the hole 72 in the region S.

With this configuration, an electromagnetic field loop formed by electromagnetic field coupling of the first inductor with the second inductor is formed in the metal shield plate 70A, and the electromagnetic field loop surrounds the region S and is formed in the main body portion 71 disposed around the hole 72. For this reason, a magnetic flux density of the electromagnetic field loop is lower than a magnetic field density of an electromagnetic field loop formed when no hole 72 is disposed in the region S and only the main body portion 71 is disposed. Thus, electromagnetic field coupling of the first inductor with the second inductor is effectively suppressed.

Although not shown in FIG. 4B, when the metal shield plate 70B is disposed between the first inductor and the second inductor as well, a hole 72 may be disposed in the region S in which the first inductor and the second inductor face each other in a plan view of the module substrate 91. In this case, the main body portion 71 is disposed on the lower side (in the negative direction of the z-axis) of the hole 72 in the region S.

With this configuration, an electromagnetic loop formed by electromagnetic field coupling of the first inductor with the second inductor is formed in the metal shield plate 70B, and the electromagnetic field loop surrounds the region S and is formed in the main body portion 71 disposed around the hole 72. For this reason, a magnetic flux density of the electromagnetic field loop is lower than a magnetic field density of an electromagnetic field loop formed when no hole 72 is disposed in the region S and only the main body portion 71 is disposed. Thus, electromagnetic field coupling of the first inductor with the second inductor is effectively suppressed.

Figure 4C:
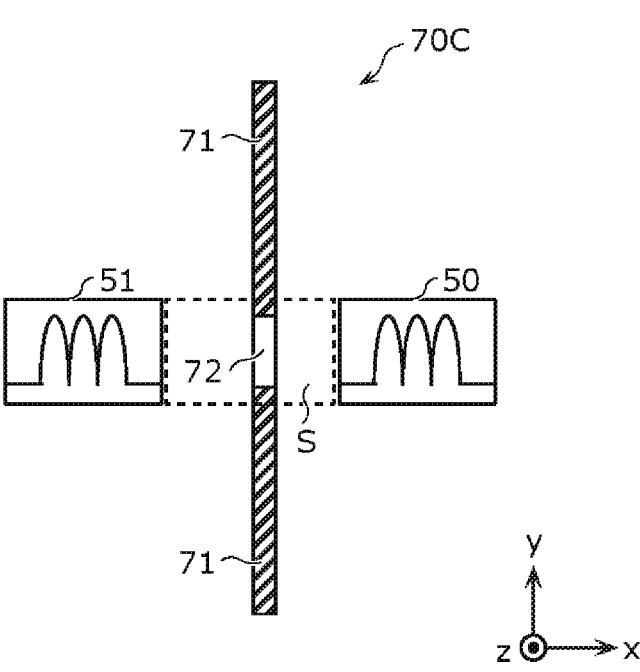
FIG. 4C is a view that shows a third example of an arrangement relation between the metal shield plate and two inductors.

FIG. 4C is a view that shows a third example of the arrangement relation between the metal shield plate 70C and the two inductors. The arrangement relation between the metal shield plate 70C and each of the first inductor of the matching circuit 50 and the second inductor of the matching circuit 51 is shown in the drawing. As shown in the drawing, in a plan view of the module substrate 91, the hole 72 is disposed in the region S in which the first inductor and the second inductor face each other. The main body portions 71 are disposed so as to sandwich the hole 72 in the region S.

With this configuration, an electromagnetic loop formed by electromagnetic field coupling of the first inductor with the second inductor is formed in the metal shield plate 70C, and the electromagnetic field loop surrounds the region S and is formed in the main body portion 71 disposed around the hole 72. For this reason, a magnetic flux density of the electromagnetic field loop is lower than a magnetic field density of an electromagnetic field loop formed when no hole 72 is disposed in the region S and only the main body portion 71 is disposed. Thus, electromagnetic field coupling of the first inductor with the second inductor is effectively suppressed.

Figure 5A:
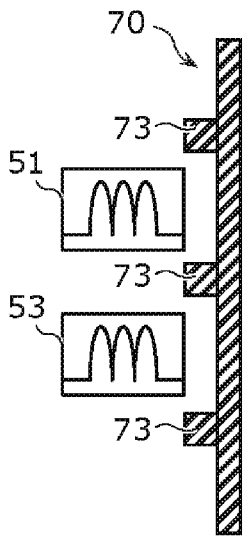
FIG. 5A is a view that shows a fourth example of an arrangement relation between the metal shield plate and two inductors.
Figure 5A:
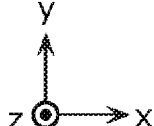

FIG. 5A is a view that shows a fourth example of the arrangement relation between the metal shield plate 70 and the two inductors. The arrangement relation between the metal shield plate 70 and each of the second inductor of the matching circuit 51 and a third inductor of the matching circuit 53 is shown in the drawing. As shown in the drawing, in a plan view of the module substrate 91, each of the second inductor and the third inductor is disposed between adjacent two of the joining portions 73 of the metal shield plate 70.

With this configuration, the second inductor and the third inductor are disposed in more proximity to the main body portion 71 of the metal shield plate 70. Thus, the electromagnetic field shielding function of the metal shield plate 70 against the second inductor and the third inductor is enhanced.

Figure 5B:
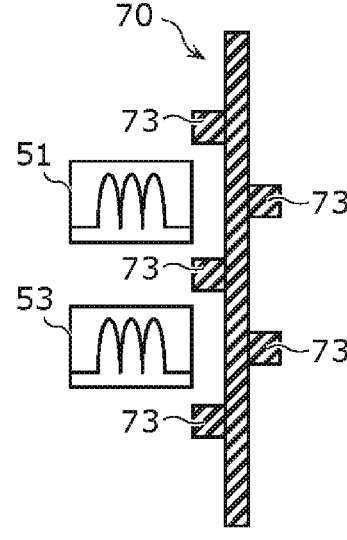
FIG. 5B is a view that shows a fifth example of an arrangement relation between the metal shield plate and two inductors.
Figure 5B:
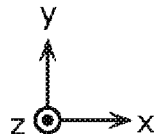

FIG. 5B is a view that shows a fifth example of the arrangement relation between the metal shield plate 70 and the two inductors. The arrangement relation between the metal shield plate 70 and each of the second inductor of the matching circuit 51 and the third inductor of the matching circuit 53 is shown in the drawing. As shown in the drawing, in a plan view of the module substrate 91, the main body portion 71 extends in a y-axial direction (first direction), and the module substrate 91 has a first region (a region on the left side of the metal shield plate 70 in FIG. 5B) and a second region (a region on the right side of the metal shield plate 70 in FIG. 5B), partitioned by the main body portion 71 in the plan view. At this time, in the plan view, the plurality of joining portions 73 is disposed alternately in the first region and the second region along the y-axis direction.

With this configuration, when the metal shield plate 70 is mounted on the module substrate 91, the metal shield plate 70 is not inclined with respect to the module substrate 91 and is upright perpendicularly to the module substrate 91. Even when solder joining the module substrate 91 with the joining portions 73 melts, the amount of solder is equalized between the right and left sides of the main body portion 71, so the metal shield plate 70 is stably disposed and does not move.

Figure 5C:
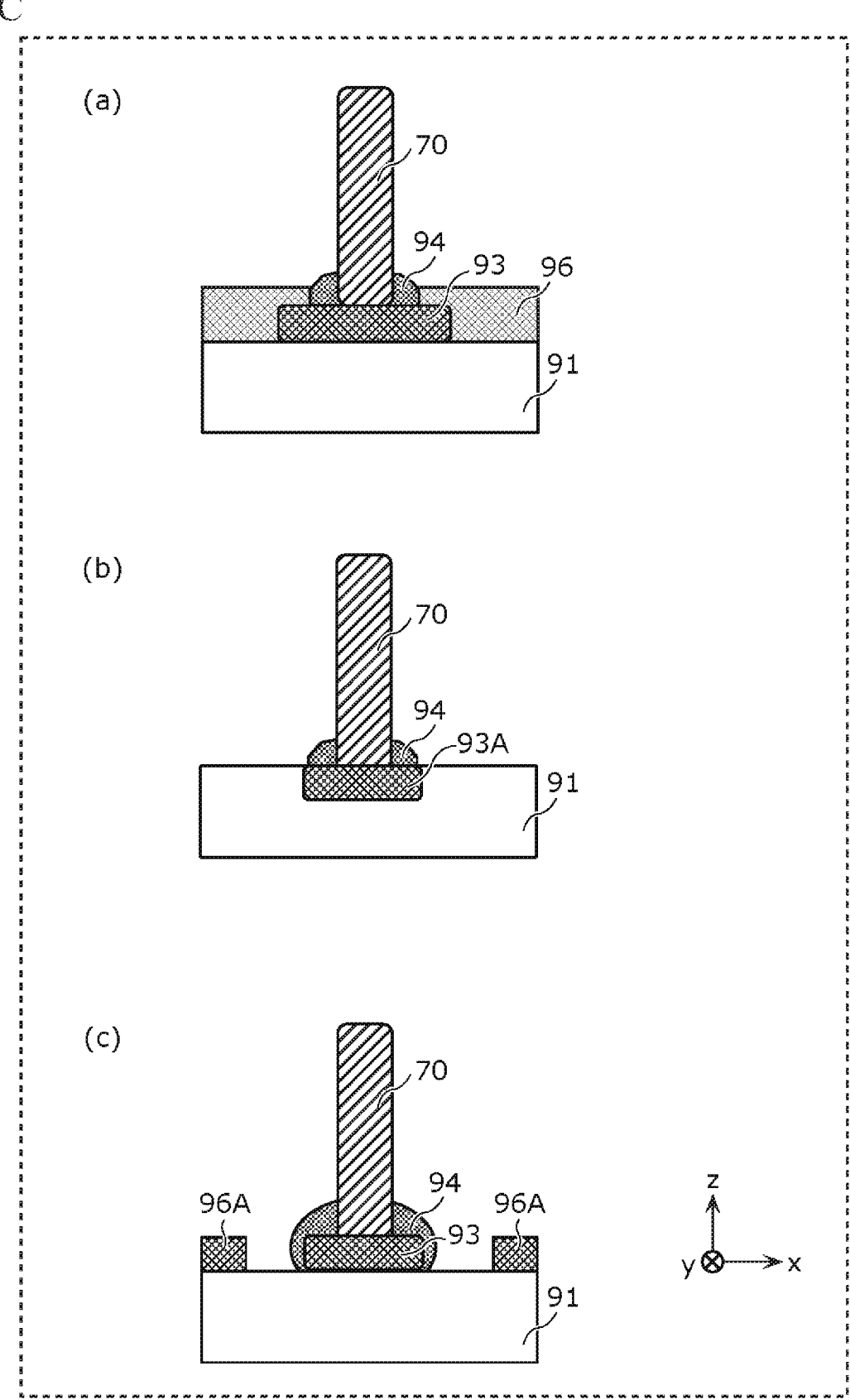
FIG. 5C is a cross-sectional view of a joining portion between the metal shield plate and a module substrate.

FIG. 5C is a cross-sectional view of the joining portion of the metal shield plate 70 with the module substrate 91. In FIG. 5C, (a) to (c) respectively show examples of a cross-sectional structure in the joining portion (a region V in (b) of FIG. 2A) between the metal shield plate 70 and the module substrate 91.

As shown in (a) of FIG. 5C, in a first example, the radio-frequency module 1A includes the metal shield plate 70, the module substrate 91, the electrode 93, a resist layer 96, and solder 94. In this example, the electrode 93 is formed on the major surface of the module substrate 91, and the resist layer 96 is formed so as to cover the outer peripheral side surface and outer peripheral top surface of the electrode 93 and has a so-called over-resist structure.

With this configuration, the solder 94 does not flow onto the side surface of the electrode 93, so self-supporting of the metal shield plate 70 is maintained.

As shown in (b) of FIG. 5C, in a second example, the radio-frequency module 1A includes the metal shield plate 70, the module substrate 91, an electrode 93A, and the solder 94. In this example, the electrode 93A is formed so as to be embedded in the major surface of the module substrate 91.

With this configuration, the solder 94 does not flow onto the side surface of the electrode 93A, so self-supporting of the metal shield plate 70 is maintained.

As shown in (c) of FIG. 5C, in a third example, the radio-frequency module 1A includes the metal shield plate 70, the module substrate 91, the electrode 93, a resist layer 96A, and the solder 94. In this example, the electrode 93 is formed on the major surface of the module substrate 91. The solder 94 is formed so as to cover the outer peripheral side surface and outer peripheral top surface of the electrode 93, and the resist layer 96A is formed in the x-axis direction of the electrode 93 so as not to cover the electrode 93 and has a so-called clearance resist structure.

With this configuration, the height of the solder 94 does not increase to the upper side (in the positive direction of the z-axis) and the metal shield plate 70 is not pulled by the solder 94, so the self-supporting of the metal shield plate 70 is maintained.

The first inductor shown in FIGS. 4A to 4C, and 5A just needs to be disposed in any one of the transmitting path, the receiving path, and the transmitting and receiving path, and the second inductor just needs to be disposed in any one of the transmitting path, the receiving path, and the transmitting and receiving path, other than the path in which the first inductor is disposed.

Figure 6:
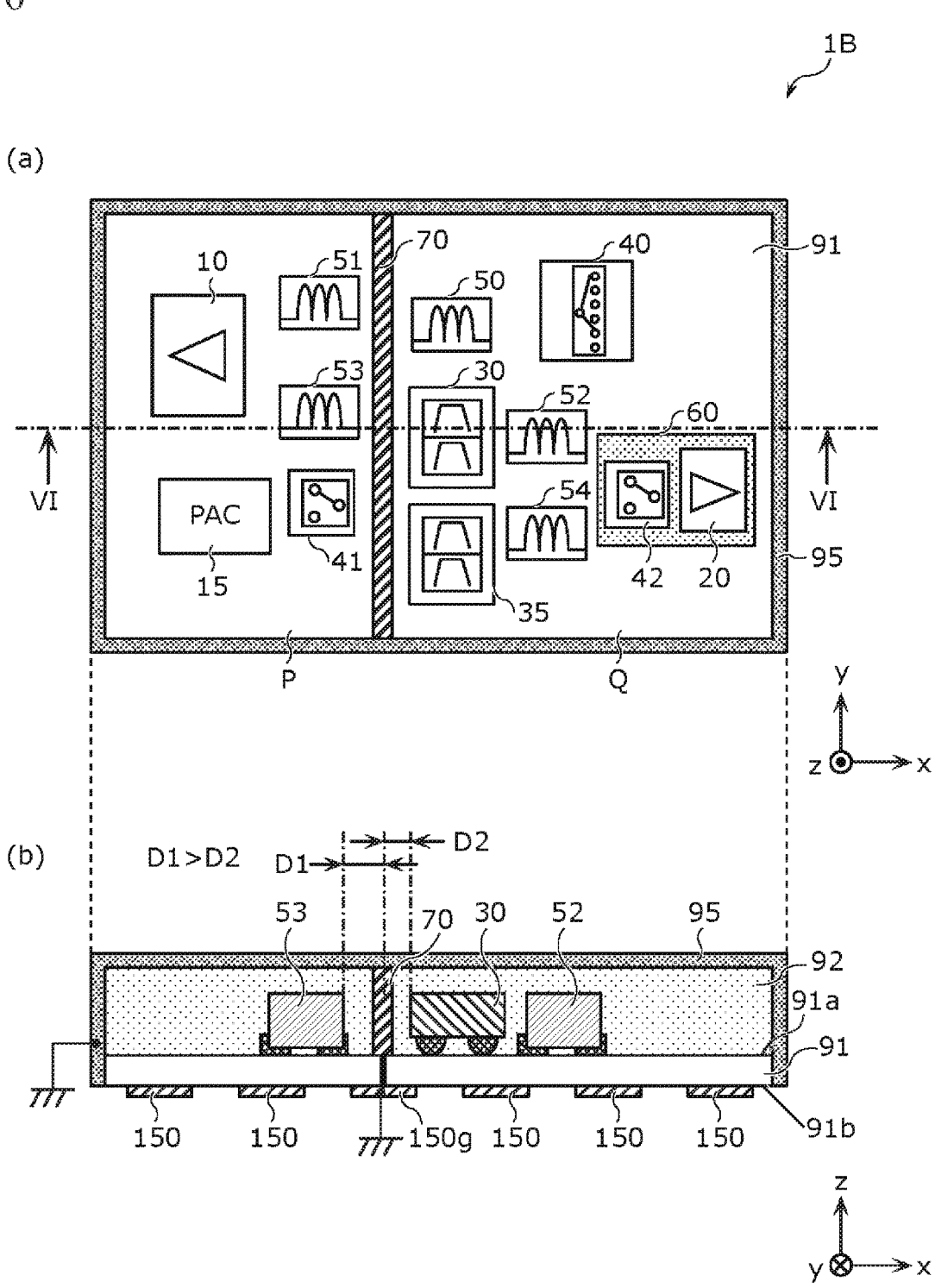
FIG. 6 shows a plan view and a cross-sectional view of a radio-frequency module according to a first modification of the first embodiment.

FIG. 6 shows a plan view and a cross-sectional view of a radio-frequency module 1B according to a first modification of the first embodiment. In FIG. 6, (a) is an arrangement view of circuit components when the major surface 91a of the module substrate 91 is viewed from the positive side of the z-axis. In FIG. 6, (b) is a cross-sectional view taken along the line VI-VI in (a) of FIG. 6. The radio-frequency module 1B according to the present modification specifically shows the arrangement of the circuit components that make up the radio-frequency module 1 according to the embodiment.

As shown in FIG. 6, the radio-frequency module 1B according to the present modification further includes the module substrate 91, the metal shield plate 70, the metal shield layer 95, the resin member 92, and the external connection terminals 150 in addition to the circuit configuration shown in FIG. 1. The radio-frequency module 1B according to the present modification differs from the radio-frequency module 1A according to the first embodiment in the arrangement of the matching circuit 53 and the duplexer 30. Hereinafter, for the radio-frequency module 1B according to the present modification, the description of the same points as those of the radio-frequency module 1A according to the first embodiment is omitted, and different points will be mainly described.

The third inductor of the matching circuit 53 is an example of a third component having an electrode on a side surface.

The duplexer 30 is an example of a fourth component having an electrode on a bottom surface and not having an electrode on a side surface.

The third inductor of the matching circuit 53 is disposed in the region P of the major surface 91a, and the duplexer 30 is disposed in the region Q of the major surface 91a.

Here, as shown in FIG. 6, in a plan view of the module substrate 91, an electrically conductive member is not disposed between the third inductor of the matching circuit 53 and the metal shield plate 70, and an electrically conductive member is not disposed between the duplexer 30 and the metal shield plate 70. At this time, a distance D1 between the third inductor of the matching circuit 53 and the metal shield plate 70 is greater than a distance D2 between the duplexer 30 and the metal shield plate 70.

With this configuration, in the third inductor with a side surface electrode, solder adheres to the side surface, so the side surface and the main body portion 71 of the metal shield plate 70 easily contact with each other with solder interposed therebetween. In contrast, in the duplexer 30 with no side surface electrode, no solder adheres to the side surface, so the side surface and the main body portion 71 of the metal shield plate 70 do not contact with each other with solder interposed therebetween even when approaching each other. In contrast, in the radio-frequency module 1B according to the present modification, since the distance D1 between the third inductor and the metal shield plate 70 is greater than the distance D2 between the duplexer 30 and the metal shield plate 70, the contact of the third inductor with the main body portion 71 with solder interposed therebetween is suppressed.

The third component having an electrode on the side surface is not limited to the third inductor of the matching circuit 53. The fourth component having an electrode on the bottom surface and not having an electrode on the side surface is not limited to the duplexer 30.

Figure 7A:
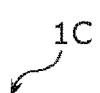
FIG. 7A shows a plan view and a cross-sectional view of a radio-frequency module according to a second modification of the first embodiment.

FIG. 7A is a plan view and a cross-sectional view of a radio-frequency module 1C according to a second modification of the first embodiment. In FIG. 7A, (a) is an arrangement view of circuit components when the major surface 91a of the module substrate 91 is viewed from the positive side of the z-axis. In FIG. 7A, (b) is a cross-sectional view taken along the line VII-VII in (a) of FIG. 7A. The radio-frequency module 1C according to the present modification specifically shows the arrangement of the circuit components that make up the radio-frequency module 1 according to the embodiment.

As shown in FIG. 7A, the radio-frequency module 1C according to the present modification further includes the module substrate 91, a metal shield plate 70A, the metal shield layer 95, the resin member 92, and the external connection terminals 150 in addition to the circuit configuration shown in FIG. 1. The radio-frequency module 1C according to the present modification differs from the radio-frequency module 1A according to the first embodiment in the arrangement of the metal shield plate 70A. Hereinafter, for the radio-frequency module 1C according to the present modification, the description of the same points as those of the radio-frequency module 1A according to the first embodiment is omitted, and different points will be mainly described.

The metal shield plate 70A is an example of a first metal shield plate. The metal shield plate 70A is a metal wall upright from the major surface 91a toward the top surface, in the positive direction of the z-axis, of the resin member 92. The metal shield plate 70A is in contact with the ground electrode of the major surface 91a and the metal shield layer 95. In other words, the metal shield plate 70A is connected to the ground at least at two portions, that is, upper and lower portions, of the metal shield plate 70A, so an electromagnetic field shielding function is enhanced.

The metal shield plate 70A partitions the major surface 91a into the region P and the region Q. As shown in (a) of FIG. 7A, the power amplifier 10, the PA control circuit 15, the matching circuits 51, 53, and the switch 41 are disposed in the region P of the major surface 91a. The low noise amplifier 20, the duplexers 30, 35, the matching circuits 50, 52, 54, and the switches 40, 42 are disposed in the region Q of the major surface 91a.

The metal shield plate 70A has the main body portion 71 upright from the major surface 91*a* toward the top surface of the resin member 92 (in the z-axis direction) and the joining portions 73 extended in the negative direction of the x-axis (toward the region P side) on the major surface 91*a* and joined with the ground electrode (not shown) of the major surface 91*a*.

The third inductor of the matching circuit 53 is an example of a first component having an electrode on the side surface.

The duplexer 30 is an example of a second component having an electrode on the bottom surface and not having an electrode on the side surface.

The third inductor of the matching circuit 53 is disposed in the region P of the major surface 91*a*, and the duplexer 30 is disposed in the region Q of the major surface 91*a*.

Here, as shown in FIG. 7A, in a plan view of the module substrate 91, an electrically conductive member is not disposed between the third inductor of the matching circuit 53 and the metal shield plate 70A, and an electrically conductive member is not disposed between the duplexer 30 and the metal shield plate 70A. At this time, the joining portion 73 is disposed between the third inductor and the main body portion 71 and is not disposed between the duplexer 30 and the main body portion 71.

With this configuration, in the metal shield plate 70A, the joining portions 73 are extended in the negative direction of the x-axis (toward the region P), so the main body portion 71 does not fall down to the region P side where the joining portions 73 are provided but easily fall down to the region Q side where no joining portion 73 is provided in the process of providing the metal shield plate 70A upright on the major surface 91*a*. In contrast, in the radio-frequency module 1C according to the present modification, the third inductor with a side surface electrode is disposed in the region P side where the main body portion 71 is hard to fall down, and the duplexer with no side surface electrode is disposed on the region Q side where the main body portion 71 is easy to fall down. Thus, even when the main body portion 71 inclines and contacts with the duplexer 30, the contact of the main body portion 71 with solder interposed therebetween is suppressed.

Figure 7B:
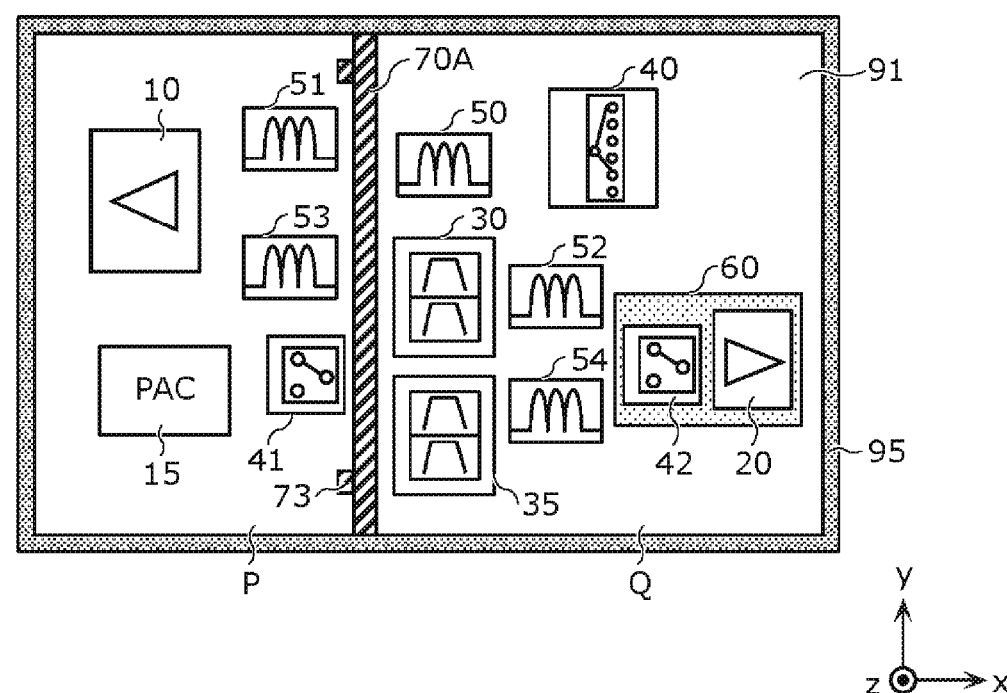
FIG. 7B is a plan view of a radio-frequency module according to a third modification of the first embodiment.

FIG. 7B is a plan view of a radio-frequency module 1H according to a third modification of the first embodiment. FIG. 7B is an arrangement view of circuit components when the major surface 91*a* of the module substrate 91 is viewed from the positive side of the z-axis. The radio-frequency module 1H according to the present modification specifically shows the arrangement of the circuit components that make up the radio-frequency module 1 according to the embodiment.

As shown in FIG. 7B, the radio-frequency module 1H according to the present modification further includes the module substrate 91, the metal shield plate 70A, the metal shield layer 95, the resin member 92, and the external connection terminals 150 in addition to the circuit configuration shown in FIG. 1. The radio-frequency module 1H according to the present modification differs from the radio-frequency module 1C according to the second modification in the configuration of the metal shield plate 70A. Hereinafter, for the radio-frequency module 1H according to the present modification, the description of the same points as those of the radio-frequency module 1C according to the second modification is omitted, and different points will be mainly described.

The metal shield plate 70A is an example of a first metal shield plate. The metal shield plate 70A is a metal wall upright from the major surface 91*a* toward the top surface, in the positive direction of the z-axis, of the resin member 92. The metal shield plate 70A is in contact with the ground electrode of the major surface 91*a* and the metal shield layer 95. In other words, the metal shield plate 70A is connected to the ground at least at two portions, that is, upper and lower portions, of the metal shield plate 70A, so an electromagnetic field shielding function is enhanced.

The metal shield plate 70A has the main body portion 71 upright from the major surface 91*a* toward the top surface of the resin member 92 (in the z-axis direction) and the joining portions 73 extended in the negative direction of the x-axis (toward the region P side) on the major surface 91*a* and joined with the ground electrode (not shown) of the major surface 91*a*.

The metal shield plate 70A partitions the major surface 91*a* into the region P and the region Q. As shown in FIG. 7B, the power amplifier 10, the PA control circuit 15, the matching circuits 51, 53, and the switch 41 are disposed in the region P of the major surface 91*a*. The low noise amplifier 20, the duplexers 30, 35, the matching circuits 50, 52, 54, and the switches 40, 42 are disposed in the region Q of the major surface 91*a*.

Here, the joining portion 73 is not disposed in a region between the matching circuit 51 and the main body portion 71, in a region between the matching circuit 53 and the main body portion 71, or in a region between the switch 41 and the main body portion 71, and the joining portions 73 are disposed in a region other than these regions.

With this configuration, the matching circuits 51, 53 and the switch 41 are disposed in proximity to the main body portion 71. Thus, the electromagnetic field shielding function of the metal shield plate 70A against the matching circuits 51, 53 and the switch 41 is enhanced.

In FIG. 7B, the joining portion 73 is disposed at two portions, but may be disposed at one portion or more.

Figure 8:
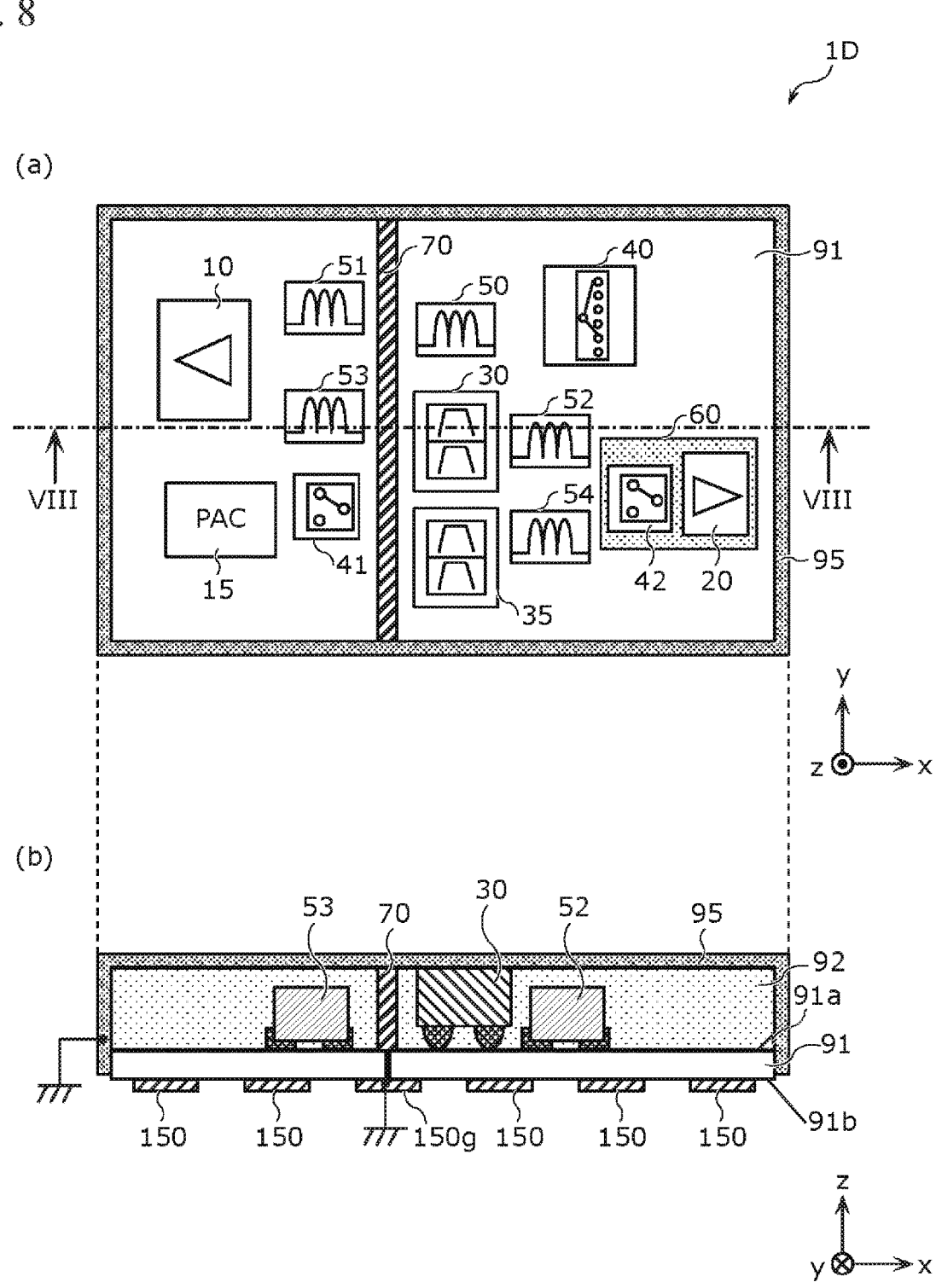
FIG. 8 shows a plan view and a cross-sectional view of a radio-frequency module according to a fourth modification of the first embodiment.

FIG. 8 is a plan view and a cross-sectional view of a radio-frequency module 1D according to a fourth modification of the first embodiment. In FIG. 8, (a) is an arrangement view of circuit components when the major surface 91*a* of the module substrate 91 is viewed from the positive side of the z-axis. In FIG. 8, (b) is a cross-sectional view taken along the line VIII-VIII in (a) of FIG. 8. The radio-frequency module 1D according to the present modification specifically shows the arrangement of the circuit components that make up the radio-frequency module 1 according to the embodiment.

As shown in FIG. 8, the radio-frequency module 1D according to the present modification further includes the module substrate 91, the metal shield plate 70, the metal shield layer 95, the resin member 92, and the external connection terminals 150 in addition to the circuit configuration shown in FIG. 1. The radio-frequency module 1D according to the present modification differs from the radio-frequency module 1A according to the first embodiment in the arrangement of the duplexer 30. Hereinafter, for the radio-frequency module 1D according to the present modification, the description of the same points as those of the radio-frequency module 1A according to the first embodiment is omitted, and different points will be mainly described.

The duplexer 30 is disposed on or above the major surface 91*a*. The bottom surface electrode of the duplexer 30 is connected to the electrode of the major surface 91*a*, and the top surface of the duplexer 30 is in contact with the metal shield layer 95.

With this configuration, in a manufacturing process, at the time when the resin member 92 is formed, the top surface of the resin member 92 can be polished by, for example, chemical mechanical polishing to expose the top surface of the duplexer 30 from the resin member 92. After that, the metal shield layer 95 can be formed directly on the top surface of the duplexer 30. Thus, the profile of the radio-frequency module 1D is reduced, and the grounding and heat dissipation of the duplexer 30 are enhanced.

At least one of the transmitting filters 31, 32 that make up the duplexer 30 may be an acoustic wave filter. With this configuration, since the heat dissipation of the acoustic wave filter is enhanced, a frequency drift due to a temperature change in the acoustic wave filter is reduced.

In a plan view of the module substrate 91, the duplexer 30 is disposed between the matching circuit 53 and the matching circuit 52. In other words, the duplexer 30 may be disposed between the first inductor and the second inductor.

With this configuration, since the first inductor and the second inductor are disposed so as to sandwich not only the metal shield plate 70 set to the ground potential but also the duplexer 30 of which the top surface is set to the ground potential, electromagnetic field coupling of the first inductor with the second inductor is further suppressed.

A circuit component of which the top surface is in contact with the metal shield layer 95 is not limited to the duplexer 30.

Figure 9:
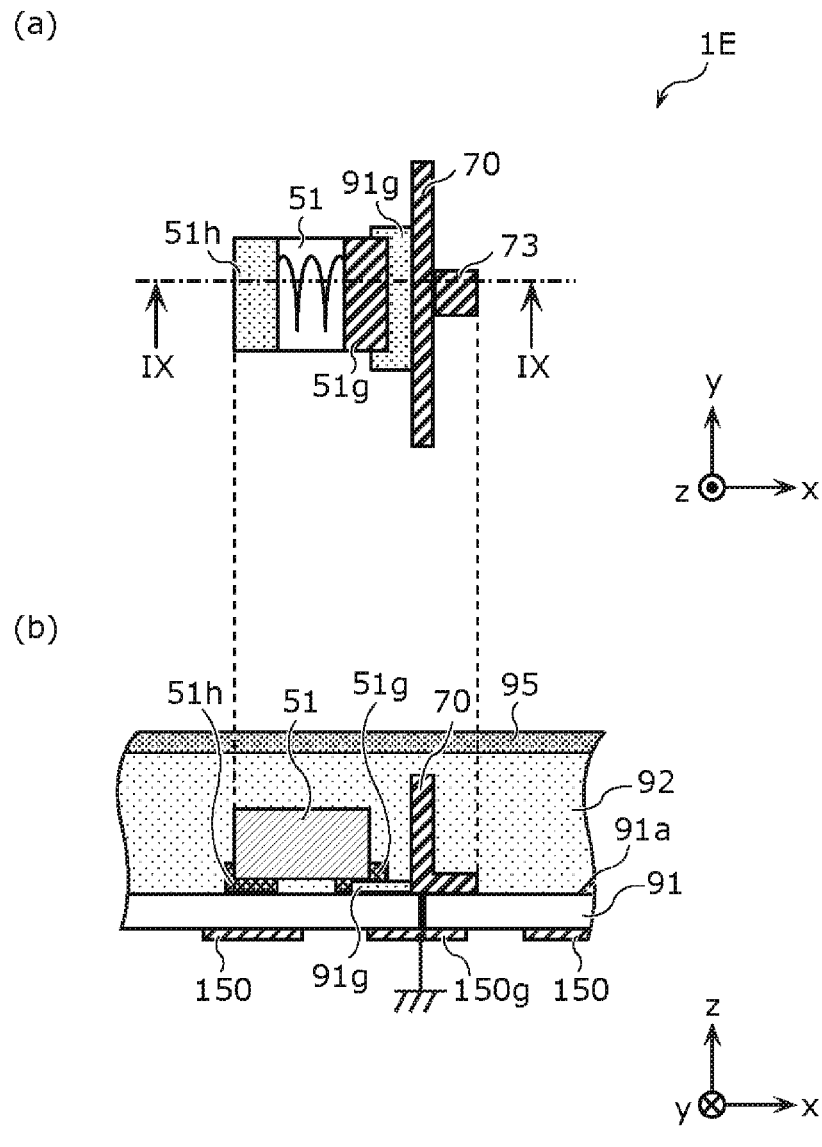
FIG. 9 shows a plan view and a cross-sectional view of a radio-frequency module according to a fifth modification of the first embodiment.

FIG. 9 shows a plan view and a cross-sectional view of a radio-frequency module 1E according to a fifth modification of the first embodiment. In FIG. 9, (a) is an arrangement view of the metal shield plate 70, the matching circuit 51, and a ground electrode 91g when the major surface 91a of the module substrate 91 is viewed from the positive side of the z-axis. In FIG. 9, (b) is a cross-sectional view taken along the line IX-IX in (a) of FIG. 9. The radio-frequency module 1E according to the present modification specifically shows the arrangement of the circuit components that make up the radio-frequency module 1 according to the embodiment. The radio-frequency module 1E according to the present modification differs from the radio-frequency module 1A according to the first embodiment in the arrangement of the metal shield plate 70, the matching circuit 51, and the ground electrode 91g. Hereinafter, for the radio-frequency module 1E according to the present modification, the description of the same points as those of the radio-frequency module 1A according to the first embodiment is omitted, and different points will be mainly described.

The metal shield plate 70 has the main body portion 71 (not shown) upright from the major surface 91a toward the top surface of the resin member 92 (in the z-axis direction) and the joining portion 73 extended in the positive direction of the x-axis (toward the region Q side) on the major surface 91a.

The inductor of the matching circuit 51 is an example of a fifth component having a signal electrode 51h and a ground electrode 51g for inputting and outputting a radio-frequency signal. Here, a distance between the metal shield plate 70 and the ground electrode 51g of the inductor of the matching circuit 51 is shorter than a distance between the metal shield plate 70 and the signal electrode 51h of the inductor of the matching circuit 51.

With this configuration, in the inductor of the matching circuit 51, the ground electrode 51g is disposed so as to be closer to the metal shield plate 70 than the signal electrode 51h, so the signal electrode 51h is less likely to contact with the metal shield plate 70 than the ground electrode 51g in the manufacturing process. If the ground electrode 51g and the metal shield plate 70 contact with each other, the ground electrode 51g and the metal shield plate 70 have the same ground potential, so the electrical characteristics of the radio-frequency module 1E are not impaired. Thus, degradation of the electrical characteristics of the radio-frequency module 1E resulting from contact of the signal electrode 51h with the metal shield plate 70 is suppressed.

The metal shield plate 70 and the ground electrode 51g of the inductor of the matching circuit 51 may be joined with the same ground electrode 91g formed on the major surface 91a.

With this configuration, since the area of the ground electrode 91g formed on the major surface 91a to which the ground electrode 51g and the metal shield plate 70 are connected is reduced, the area of the module substrate 91 is saved.

Second Embodiment

In the present embodiment, a configuration in which a plurality of metal shield plates is disposed on the major surface 91a of the radio-frequency module 1 will be described.

Figure 10A:
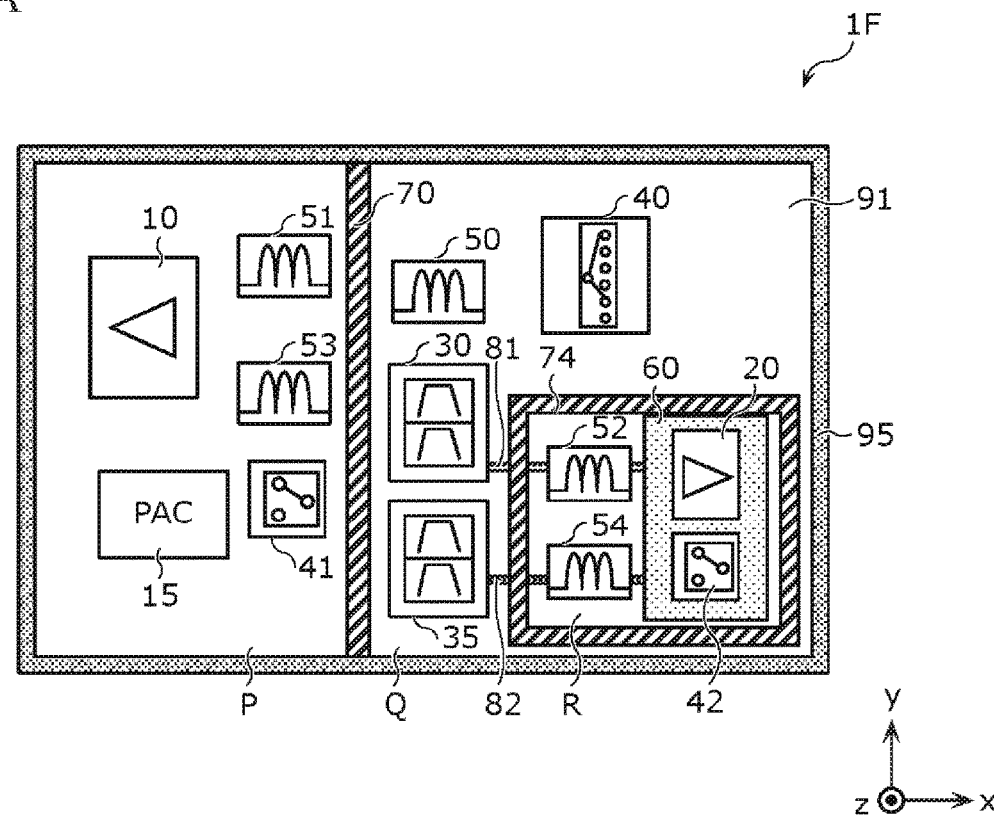
FIG. 10A is a plan view of a radio-frequency module according to a second embodiment.

2.1 Arrangement of Circuit Components of Radio-Frequency Module 1F According to Second Embodiment FIG. 10A is a plan view of a radio-frequency module 1F according to a second embodiment. FIG. 10A is an arrangement view of circuit components when the major surface 91a of the module substrate 91 is viewed from the positive side of the z-axis. The radio-frequency module 1F specifically shows the arrangement of the circuit components that make up the radio-frequency module 1 shown in FIG. 1.

As shown in FIG. 10A, the radio-frequency module 1F according to the present embodiment further includes the module substrate 91, metal shield plates 70, 74, the metal shield layer 95, the resin member 92 (not shown), and the external connection terminals 150 (not shown) in addition to the circuit configuration shown in FIG. 1. The radio-frequency module 1F according to the present embodiment differs from the radio-frequency module 1A according to the first embodiment in that the metal shield plate 74 is added. Hereinafter, for the radio-frequency module 1F according to the present embodiment, the description of the same points as those of the radio-frequency module 1A according to the first embodiment is omitted, and different points will be mainly described.

The metal shield plate 74 is an example of a third metal shield plate. The metal shield plate 74 is a metal wall upright from the major surface 91a toward the top surface, in the positive direction of the z-axis, of the resin member 92. The metal shield plate 74 is in contact with the ground electrode of the major surface 91a and the metal shield layer 95. In other words, the metal shield plate 74 is connected to the ground at least at two portions, that is, upper and lower portions, of the metal shield plate 74, so an electromagnetic field shielding function is enhanced. The metal shield plate 74 may be in contact with a shield surface that is in contact with the top surface of the resin member 92, of a shield surface that makes up the ground electrode of the major surface 91a and the metal shield layer 95, or may be in contact with a shield surface that is in contact with a side surface of the resin member 92, of a shield surface that makes up the ground electrode of the major surface 91a and the metal shield layer 95.

In the present embodiment, the matching circuit 50 is disposed in the transmitting and receiving path CTR connecting the antenna connection terminal 100 with the common terminal 40*a* of the switch 40 and includes a first inductor. The matching circuit 51 is disposed in the transmitting path AT connecting the transmitting input terminal 110 with the common terminal 40*a* of the switch 40 and includes a second inductor. The matching circuit 52 is disposed in the receiving path AR connecting the receiving output terminal 120 with the common terminal 40*a* of the switch 40 and includes a third inductor.

Here, as shown in FIG. 10A, the metal shield plate 70 is disposed on the major surface 91*a* between the first inductor of the matching circuit 50 and the second inductor of the matching circuit 51 in a plan view of the module substrate 91. The metal shield plate 74 is disposed on the major surface 91*a* between the first inductor of the matching circuit 50 and the third inductor of the matching circuit 52 in a plan view of the module substrate 91.

In other words, the metal shield plates 70, 74 partition the major surface 91*a* into the region P, the region Q, and a region R. As shown in FIG. 10A, the power amplifier 10, the PA control circuit 15, the matching circuits 51, 53, and the switch 41 are disposed in the region P of the major surface 91*a*. The duplexers 30, 35, the matching circuit 50, and switch 40 are disposed in the region Q of the major surface 91*a*. The low noise amplifier 20, the matching circuits 52, 54, and the switch 42 are disposed in the region R of the major surface 91*a*.

With this configuration, the second inductor disposed in the transmitting path AT and the first inductor disposed in the transmitting and receiving path CTR are disposed so as to sandwich the metal shield plate 70 set to the ground potential, so electromagnetic field coupling of the first inductor with the second inductor is suppressed. The first inductor disposed in the transmitting and receiving path CTR and the third inductor disposed in the receiving path AR are disposed so as to sandwich the metal shield plate 74 set to the ground potential, so electromagnetic field coupling of the first inductor with the third inductor is suppressed. Thus, a decrease in the quality of a transmitting signal resulting from the output of a high-power transmitting signal amplified by the power amplifier 10 and on which a harmonic component is superposed from the antenna connection terminal 100 without passing through the transmitting filter 31 is suppressed. Degradation of receiving sensitivity resulting from flow of the harmonics or spurious waves, such as intermodulation distortion between a transmitting signal and another radio-frequency signal, into the receiving path AR or the receiving path BR due to the electromagnetic field coupling is further suppressed.

In the present embodiment, in a plan view of the module substrate 91, the low noise amplifier 20, the matching circuits 52, 54, and the switch 42, disposed in the receiving paths AR, BR, are surrounded by the metal shield plate 74.

With this configuration, flow of a high-power transmitting signal, its harmonics, and an intermodulation distortion component into the receiving paths AR, BR is suppressed to a high degree.

The metal shield plate 74 may surround at least one of the matching circuits 52, 54. With this configuration as well, the inductors that most easily electromagnetically couple each other of the circuit components are disposed so as to be isolated by the metal shield plate 74.

Instead of the metal shield plate 74 or in addition to the metal shield plate 74, the metal shield plate 70 may surround at least one of the matching circuits 51, 53 in a plan view of the module substrate 91.

Instead of the metal shield plate 74 or in addition to the metal shield plate 74, the metal shield plate 70 may surround the matching circuit 50 in a plan view of the module substrate 91.

With this configuration, a decrease in the quality of a transmitting signal resulting from the output of a high-power transmitting signal on which harmonics are superposed from the antenna connection terminal 100 is suppressed. A decrease in receiving sensitivity resulting from flow of a high-power transmitting signal, its harmonics, and an intermodulation distortion component into the receiving paths AR, BR is suppressed.

In the configuration in which the metal shield plate 70 or the metal shield plate 74 surrounds circuit components, part of the metal shield plate may be the metal shield layer 95.

In FIG. 10A, the metal shield plate 70 does not need to be disposed. In this case, the metal shield plate 74 is an example of a first metal shield plate, the matching circuit 50 includes a second inductor, the matching circuit 52 includes a first inductor, and the matching circuit 54 includes a first inductor.

Here, as shown in FIG. 10A, the receiving filter 32 for frequency division duplex, included in the duplexer 30, is disposed adjacent to the metal shield plate 74. The receiving filter 34 for frequency division duplex, included in the duplexer 35, is disposed adjacent to the metal shield plate 74. The receiving filter 32 and the low noise amplifier 20 are connected by a wire 81 with the matching circuit 52 interposed therebetween. The receiving filter 34 and the low noise amplifier 20 are connected by a wire 82 with the matching circuit 54 interposed therebetween. The metal shield plate 74 is disposed between the matching circuit 52 and the receiving filter 32 and is disposed between the matching circuit 54 and the receiving filter 34.

Figure 10B:
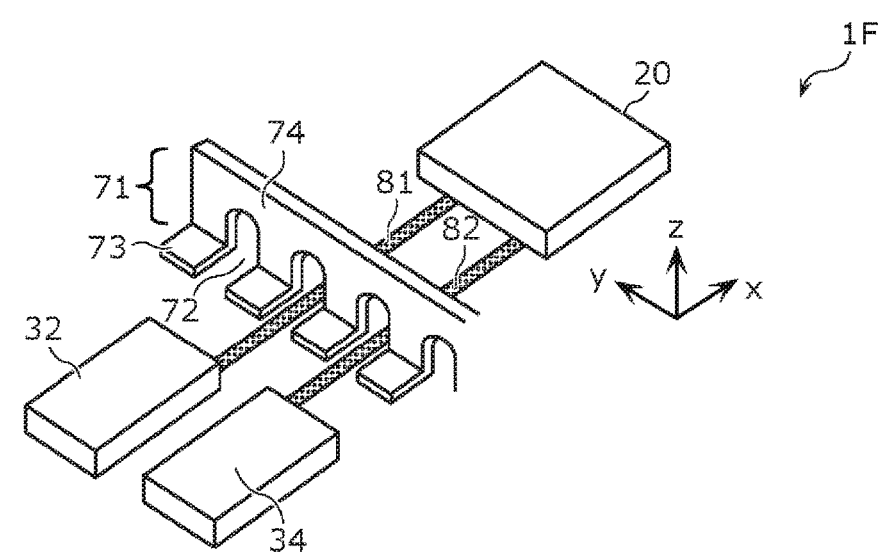
FIG. 10B is a perspective view that shows an arrangement relation between a metal shield plate and wires of the radio-frequency module according to the second embodiment.

FIG. 10B is a perspective view that shows an arrangement relation between the metal shield plate 74 and the wires 81, 82 of the radio-frequency module 1F according to the second embodiment. As shown in the drawing, the wires 81, 82 are formed in the surface layer of the module substrate 91. Thus, the wires 81, 82 are shortened. In a plan view of the module substrate 91, the wires 81, 82 are formed so as to overlap the holes 72 of the metal shield plate 74.

With this configuration, unnecessary signals that transmit through the wires 81, 82 are suppressed by the holes 72, so a good shielding effect of the radio-frequency module 1F is obtained.

Figure 11:
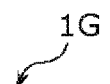
FIG. 11 shows a plan view and a cross-sectional view of a radio-frequency module according to a modification of the second embodiment.

2.2 Arrangement of Circuit Components of Radio-Frequency Module 1G According to Modification FIG. 11 is a plan view and a cross-sectional view of a radio-frequency module 1G according to a modification of the second embodiment. In FIG. 11, (a) is an arrangement view of circuit components when the major surface 91*a* of the module substrate 91 is viewed from the positive side of the z-axis. In FIG. 11, (b) is a cross-sectional view taken along the line XI-XI in (a) of FIG. 11. The radio-frequency module 1G according to the present modification specifically shows the arrangement of the circuit components that make up the radio-frequency module 1 according to the embodiment.

As shown in FIG. 11, the radio-frequency module 1G according to the present modification further includes the module substrate 91, metal shield plates 75*a* to 75*d*, 76*a*, 76*b*, the metal shield layer 95, the resin member 92 (not shown), and the external connection terminals 150 (not shown) in addition to the circuit configuration shown in FIG. 1. The radio-frequency module 1G according to the present modification differs from the radio-frequency module 1F according to the second embodiment in the configuration of the metal shield plates. Hereinafter, for the radio-frequency module 1G according to the present modification, the description of the same points as those of the radio-frequency module 1F according to the second embodiment is omitted, and different points will be mainly described.

Each of the metal shield plates 75a, 75c is an example of a first metal shield plate. Each of the metal shield plates 75a, 75c is a metal wall upright from the major surface 91a toward the top surface, in the positive direction of the z-axis, of the resin member 92. Each of the metal shield plates 75a, 75c is in contact with the ground electrode of the major surface 91a and the metal shield layer 95.

Each of the metal shield plates 75b, 75d is an example of a second metal shield plate. Each of the metal shield plates 75a, 75c is a metal wall upright from the major surface 91a toward the top surface, in the positive direction of the z-axis, of the resin member 92. Each of the metal shield plates 75b, 75d is in contact with the ground electrode of the major surface 91a and the metal shield layer 95. The metal shield plate 75b is disposed apart from the metal shield plate 75a in a plan view of the module substrate 91. The metal shield plate 75d is disposed apart from the metal shield plate 75c in a plan view of the module substrate 91.

The metal shield plates 75a, 75b have an overlapping part when viewed in a direction normal to the metal shield plates 75a, 75b, and the metal shield plate 75a and the metal shield plate 75b are parallel to each other at the overlapping part. The metal shield plates 75c, 75d have an overlapping part when viewed in a direction normal to the metal shield plates 75c, 75d, and the metal shield plate 75c and the metal shield plate 75d are parallel to each other at the overlapping part.

With the above configuration, the radio-frequency module 1G enhances the electromagnetic field shielding function of the metal shield plates with the overlapping parts.

In the present modification, the matching circuit 50 is disposed in the transmitting and receiving path CTR and includes a first inductor. The matching circuit 51 is disposed in the transmitting path AT and includes a second inductor. The matching circuit 52 is disposed in the receiving path AR and includes a third inductor.

Here, as shown in FIG. 11, in a plan view of the module substrate 91, the overlapping part between the metal shield plate 75a and the metal shield plate 75b is disposed between the first inductor and the second inductor.

With this configuration, the second inductor disposed in the transmitting path AT and the first inductor disposed in the transmitting and receiving path CTR are disposed so as to sandwich the overlapping part, so electromagnetic field coupling of the first inductor with the second inductor is further suppressed. Thus, a decrease in the quality of a transmitting signal resulting from the output of a high-power transmitting signal amplified by the power amplifier 10 and on which a harmonic component is superposed from the antenna connection terminal 100 without passing through the transmitting filter 31 is further suppressed. Degradation of receiving sensitivity resulting from flow of the harmonics or spurious waves, such as intermodulation distortion between a transmitting signal and another radio-frequency signal, into the receiving path AR or the receiving path BR due to the electromagnetic field coupling is further suppressed.

A combination of the first inductor with the second inductor disposed so as to be isolated by the overlapping part is not limited to a combination of the inductor disposed in the transmitting and receiving path with the inductor disposed in the transmitting path. A combination of the first inductor with the second inductor may be a combination of the inductor disposed in the transmitting and receiving path with the inductor disposed in the receiving path. With this configuration, degradation of receiving sensitivity resulting from flow of a high-power transmitting signal amplified by the power amplifier 10 and its harmonic component into the receiving path AR or the receiving path BR without passing through the receiving filter 32 or the receiving filter 34 is further suppressed.

Alternatively, a combination of the first inductor with the second inductor may be a combination of the inductor disposed in the transmitting path with the inductor disposed in the receiving path. With this configuration, degradation of receiving sensitivity resulting from flow of a high-power transmitting signal amplified by the power amplifier 10 and its harmonic component into the receiving path AR or the receiving path BR without passing through the transmitting filter 31 or the transmitting filter 33 or the receiving filter 32 or the receiving filter 34 is further suppressed.

In other words, the first inductor just needs to be disposed in any one of the transmitting path, the receiving path, and the transmitting and receiving path, and the second inductor just needs to be disposed in any one of the transmitting path, the receiving path, and the transmitting and receiving path, other than the path in which the first inductor is disposed.

The metal shield plate 75a and the metal shield plate 75b desirably have the same shape. With this configuration, a manufacturing process for the metal shield plates is simplified, so a manufacturing cost is reduced.

In a plan view of the module substrate 91, the low noise amplifier 20, the matching circuits 52, 54, and the switch 42, disposed in the receiving paths AR, BR, are surrounded by the metal shield plates 76a, 76b and the metal shield layer 95.

With this configuration, flow of a high-power transmitting signal, its harmonics, and an intermodulation distortion component into the receiving paths AR, BR is suppressed to a high degree.

The metal shield plates 76a, 76b and the metal shield layer 95 may surround at least one of the matching circuits 52, 54. With this configuration as well, the inductors that most easily electromagnetically couple each other of the circuit components are disposed so as to be isolated.

Only the metal shield plates 76a, 76b may surround at least one of the matching circuits 52, 54. With this configuration as well, the inductors that most easily electromagnetically couple each other of the circuit components are disposed so as to be isolated.

The metal shield plate 76a and the metal shield plate 76b are separate bodies and are in contact with each other. In a plan view of the module substrate 91, an angle formed between the metal shield plate 76a and the metal shield plate 76b is substantially 90 degrees. With this configuration, since the metal shield plate 76a and the metal shield plate 76b are upright and support each other, the circuit components are allowed to be disposed on the major surface 91a with high accuracy.

Instead of the metal shield plates 76a, 76b or in addition to the metal shield plate 74, the metal shield plate 70 may be configured as two metal shield plates, and, in a plan view of the module substrate 91, the two metal shield plates and the metal shield layer may surround at least one of the matching circuits 51, 53. Alternatively, the two metal shield plates and the metal shield layer may surround the matching circuit 50.

With this configuration, a decrease in the quality of a transmitting signal resulting from the output of a high-power transmitting signal on which harmonics are superposed from the antenna connection terminal 100 is suppressed. A decrease in receiving sensitivity resulting from flow of a high-power transmitting signal, its harmonics, and an intermodulation distortion component into the receiving paths AR, BR is suppressed.

Only the two metal shield plates may surround at least one of the matching circuits 51, 53 or may surround the matching circuit 50. With this configuration as well, the inductors that most easily electromagnetically couple each other of the circuit components are disposed so as to be isolated.

Third Embodiment

3.1 Circuit Configuration of Radio-Frequency Module 201 and Communication Device 206

Figure 12:
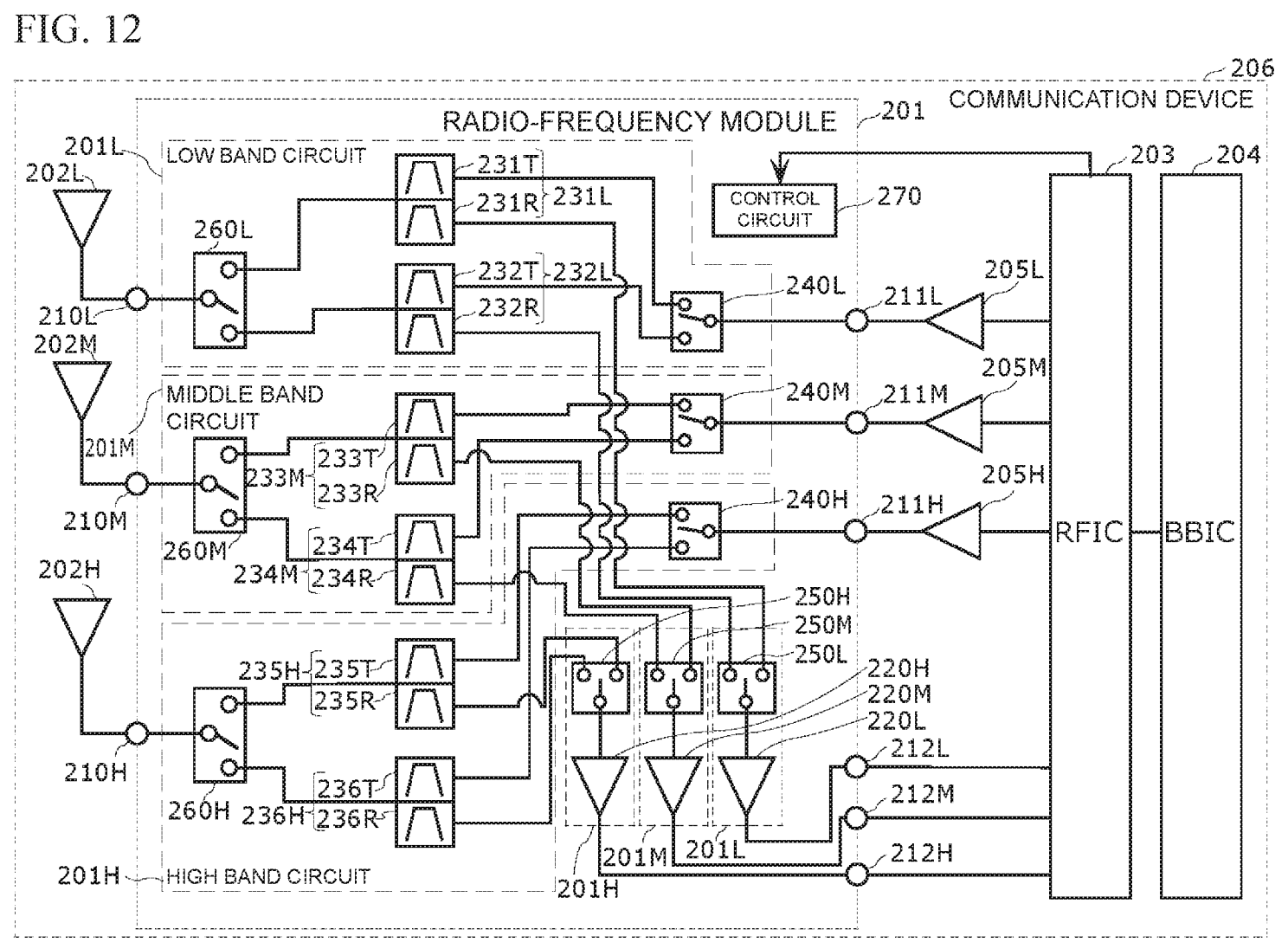

FIG. 12 is a circuit configuration diagram of a radio-frequency module 201 and a communication device 206 according to a third embodiment. As shown in the drawing, the communication device 206 includes the radio-frequency module 201, antennas 202L, 202M, 202H, an RFIC 203, and a BBIC 204. The communication device 206 according to the present embodiment mainly differs from the communication device 5 according to the first embodiment in the configuration of the radio-frequency module 201. Thus, hereinafter, the configuration of the radio-frequency module 201 will be mainly described.

The radio-frequency module 201 includes power amplifiers 205L, 205M, 205H, a low band circuit 201L, a middle band circuit 201M, a high band circuit 201H, antenna connection terminals 210L, 210M, 210H, transmitting input terminals 211L, 211M, 211H, receiving output terminals 212L, 212M, 212H, and a control circuit 270.

The radio-frequency module 201 according to the present embodiment transmits a transmitting signal group and a receiving signal group in a plurality of communication band groups. Specifically, the radio-frequency module 201 transmits a transmitting signal group and a receiving signal group in each of a low band group, a middle band group, and a high band group.

The low band group is a frequency band group made up of a plurality of communication bands corresponding to 4G and 5G and has, for example, a frequency range of 600 MHz to 1000 MHz.

The middle band group is a frequency band group made up of a plurality of communication bands corresponding to 4G and 5G and lies at higher frequencies than the low band group. The middle band group has, for example, a frequency range of 1.5 GHz to 2.2 GHZ.

The high band group is a frequency band group made up of a plurality of communication bands corresponding to 4G and 5G and lies at higher frequencies than the middle band group. The high band group has, for example, a frequency range of 2.4 GHz to 2.8 GHz.

The antenna 202L is connected to the antenna connection terminal 210L of the radio-frequency module 201. The antenna 202L radiates a transmitting signal outputted from the low band circuit 201L of the radio-frequency module 201. The antenna 202L receives a receiving signal from an outside source and outputs the receiving signal to the low band circuit 201L.

The antenna 202M is connected to the antenna connection terminal 210M of the radio-frequency module 201. The antenna 202M radiates a transmitting signal outputted from the middle band circuit 201M of the radio-frequency module 201. The antenna 202M receives a receiving signal from an outside source and outputs the receiving signal to the middle band circuit 201M.

The antenna 202H is connected to the antenna connection terminal 210H of the radio-frequency module 201. The antenna 202H radiates a transmitting signal outputted from the high band circuit 201H of the radio-frequency module 201. The antenna 202H receives a receiving signal from an outside source and outputs the receiving signal to the high band circuit 201H.

Each of the antenna connection terminals 210L, 210M, 210H is an example of an external connection terminal for electrically connecting the radio-frequency module 201 with an element provided outside the radio-frequency module 201. Specifically, the antenna connection terminal 210L is connected to the antenna 202L. The antenna connection terminal 210M is connected to the antenna 202M. The antenna connection terminal 210H is connected to the antenna 202H.

Each of the transmitting input terminals 211L, 211M, 211H is an example of an external connection terminal for electrically connecting the radio-frequency module 201 with an element provided outside the radio-frequency module 201. Specifically, the transmitting input terminal 211L is an example of a first external connection terminal connected to an output terminal of the power amplifier 205L. A first transmitting signal group amplified by the power amplifier 205L is inputted to the transmitting input terminal 211L. The transmitting input terminal 211M is an example of a second external connection terminal connected to an output terminal of the power amplifier 205M. A second transmitting signal group amplified by the power amplifier 205M is inputted to the transmitting input terminal 211M. The transmitting input terminal 211H is an example of a third external connection terminal connected to an output terminal of the power amplifier 205H. A third transmitting signal group amplified by the power amplifier 205H is inputted to the transmitting input terminal 211H.

Each of the receiving output terminals 212L, 212M, 212H is an example of an external connection terminal for electrically connecting the radio-frequency module 201 with an element provided outside the radio-frequency module 201. Specifically, all the receiving output terminals 212L, 212M, 212H are connected to the RFIC 203.

The low band circuit 201L transmits a transmitting signal and a receiving signal in a communication band belonging to the low band group. As shown in FIG. 12, the low band circuit 201L includes a low noise amplifier 220L, duplexers 231L, 232L, and switches 240L, 250L, 260L.

Although not shown in FIG. 12, the low band circuit 201L may include a matching circuit for performing impedance matching between elements, a filter circuit that limits a pass band for a transmitting signal or a receiving signal, or the like. For example, a matching circuit 251 including an inductor is provided between the switch 240L and a transmitting filter 231T. For example, a matching circuit 251 including an inductor is provided between the switch 250L and a receiving filter 231R.

The power amplifier 205L is an example of a first power amplifier that amplifies a first transmitting signal group in a first band group. Specifically, the power amplifier 205L amplifies a transmitting signal in a communication band belonging to the low band group.

The low noise amplifier 220L is an example of a first low noise amplifier that amplifies a first receiving signal group in the first band group. Specifically, the low noise amplifier 220L is a receiving low noise amplifier that amplifies a receiving signal in a communication band belonging to the low band group with low noise.

The duplexers 231L, 232L are an example of a plurality of first filters respectively having pass bands corresponding to a plurality of first communication bands. The duplexer 231L and the duplexer 232L respectively have different pass bands.

The duplexer 231L passes, for example, a radio-frequency signal in a communication band A of the low band group. As shown in FIG. 12, the duplexer 231L is made up of the transmitting filter 231T and the receiving filter 231R. An input terminal of the transmitting filter 231T is connected to the transmitting input terminal 211L with the switch 240L interposed therebetween. An output terminal of the receiving filter 231R is connected to the receiving output terminal 212L with the switch 250L and the low noise amplifier 220L interposed therebetween. The output terminal of the transmitting filter 231T and the input terminal of the receiving filter 231R are connected to each other to make up a common terminal and are connected to the antenna connection terminal 210L with the switch 260L interposed therebetween.

The transmitting filter 231T is disposed in a transmitting signal path connecting the transmitting input terminal 211L with the antenna connection terminal 210L and passes a transmitting signal in a transmitting band of the communication band A, of transmitting signals amplified by the power amplifier 205L and inputted from the transmitting input terminal 211L. The receiving filter 231R is disposed in a receiving signal path connecting the antenna connection terminal 210L with the receiving output terminal 212L and passes a receiving signal in a receiving band of the communication band A, of receiving signals inputted from the antenna connection terminal 210L.

The duplexer 232L passes, for example, a radio-frequency signal in a communication band B of the low band group. The communication band B is a communication band different from the communication band A. As shown in FIG. 12, the duplexer 232L is made up of a transmitting filter 232T and a receiving filter 232R. An input terminal of the transmitting filter 232T is connected to the transmitting input terminal 211L with the switch 240L interposed therebetween. An output terminal of the receiving filter 232R is connected to the receiving output terminal 212L with the switch 250L and the low noise amplifier 220L interposed therebetween. The output terminal of the transmitting filter 232T and the input terminal of the receiving filter 232R are connected to each other to make up a common terminal and is connected to the antenna connection terminal 210L with the switch 260L interposed therebetween.

The transmitting filter 232T is disposed in a transmitting signal path connecting the transmitting input terminal 211L with the antenna connection terminal 210L and passes a transmitting signal in a transmitting band of the communication band B, of transmitting signals amplified by the power amplifier 205L and inputted from the transmitting input terminal 211L. The receiving filter 232R is disposed in a receiving signal path connecting the antenna connection terminal 210L with the receiving output terminal 212L and passes a receiving signal in a receiving band of the communication band B, of receiving signals inputted from the antenna connection terminal 210L.

The switch 240L switches between continuity and discontinuity of the transmitting input terminal 211L with each of the duplexers 231L, 232L. More specifically, the switch 240L is disposed in a transmitting signal path connecting the transmitting input terminal 211L with each of the transmitting filters 231T, 232T and switches between continuity and discontinuity of the transmitting input terminal 211L with the transmitting filter 231T and between continuity and discontinuity of the transmitting input terminal 211L with the transmitting filter 232T.

The switch 250L switches between continuity and discontinuity of each of the duplexers 231L, 232L with the input terminal of the low noise amplifier 220L. More specifically, the switch 250L is disposed in a receiving signal path connecting each of the receiving filters 231R, 232R with the low noise amplifier 220L and switches between continuity and discontinuity of the receiving filter 231R with the low noise amplifier 220L and between continuity and discontinuity of the receiving filter 232R with the low noise amplifier 220L.

The switch 260L switches between continuity and discontinuity of the antenna connection terminal 210L with each of the duplexers 231L, 232L.

In the low band circuit 201L, the number of communication bands to be transmitted is not limited to two and may be only one or three or more. Depending on the number of communication bands, the number of duplexers, the configuration (for example, the number of selection terminals) of each switch, and the like are adjusted as needed.

The middle band circuit 201M transmits a transmitting signal and a receiving signal in a communication band belonging to the middle band group. As shown in FIG. 12, the middle band circuit 201M includes a low noise amplifier 220M, duplexers 233M, 234M, and switches 240M, 250M, 260M.

Although not shown in FIG. 12, the middle band circuit 201M may include a matching circuit for performing impedance matching between elements, a filter circuit that limits a pass band for a transmitting signal or a receiving signal, or the like. For example, a matching circuit 252 including an inductor is provided between the switch 240M and a transmitting filter 233T. A matching circuit including an inductor is provided between the switch 250M and a receiving filter 233R.

The power amplifier 205M is an example of a second power amplifier that amplifies a second transmitting signal group in a second band group. Specifically, the power amplifier 205M amplifies a transmitting signal in a communication band belonging to the middle band group.

The low noise amplifier 220M is an example of a second low noise amplifier that amplifies a second receiving signal group in the second band group. Specifically, the low noise amplifier 220M is a receiving low noise amplifier that amplifies a receiving signal in a communication band belonging to the middle band group with low noise.

The duplexers 233M, 234M are an example of a plurality of second filters respectively having pass bands corresponding to a plurality of second communication bands. The duplexer 233M and the duplexer 234M respectively have different pass bands.

The duplexer 233M passes, for example, a radio-frequency signal in a communication band C of the middle band group. As shown in FIG. 12, the duplexer 233M is made up of the transmitting filter 233T and the receiving filter 233R. An input terminal of the transmitting filter 233T is connected to the transmitting input terminal 211M with the switch 240M interposed therebetween. An output terminal of the receiving filter 233R is connected to the receiving output terminal 212M with the switch 250M and the low noise amplifier 220M interposed therebetween. The output terminal of the transmitting filter 233T and the input terminal of the receiving filter 233R are connected to each other to make up a common terminal and are connected to the antenna connection terminal 210M with the switch 260M interposed therebetween.

The transmitting filter 233T is disposed in a transmitting signal path connecting the transmitting input terminal 211M with the antenna connection terminal 210M and passes a transmitting signal in a transmitting band of the communication band C, of transmitting signals amplified by the power amplifier 205M and inputted from the transmitting input terminal 211M. The receiving filter 233R is disposed in a receiving signal path connecting the antenna connection terminal 210M with the receiving output terminal 212M and passes a receiving signal in a receiving band of the communication band C, of receiving signals inputted from the antenna connection terminal 210M.

The duplexer 234M passes, for example, a radio-frequency signal in a communication band D of the middle band group. The communication band D is a communication band different from the communication band C. As shown in FIG. 12, the duplexer 234M is made up of a transmitting filter 234T and a receiving filter 234R. An input terminal of the transmitting filter 234T is connected to the transmitting input terminal 211M with the switch 240M interposed therebetween. An output terminal of the receiving filter 234R is connected to the receiving output terminal 212M with the switch 250M and the low noise amplifier 220M interposed therebetween. The output terminal of the transmitting filter 234T and the input terminal of the receiving filter 234R are connected to each other to make up a common terminal and are connected to the antenna connection terminal 210M with the switch 260M interposed therebetween.

The transmitting filter 234T is disposed in a transmitting signal path connecting the transmitting input terminal 211M with the antenna connection terminal 210M and passes a transmitting signal in a transmitting band of the communication band D, of transmitting signals amplified by the power amplifier 205M and inputted from the transmitting input terminal 211M. The receiving filter 234R is disposed in a receiving signal path connecting the antenna connection terminal 210M with the receiving output terminal 212M and passes a receiving signal in a receiving band of the communication band D, of receiving signals inputted from the antenna connection terminal 210M.

The switch 240M switches between continuity and discontinuity of the transmitting input terminal 211M with each of the duplexers 233M, 234M. More specifically, the switch 240M is disposed in a transmitting signal path connecting the transmitting input terminal 211M with each of the transmitting filters 233T, 234T and switches between continuity and discontinuity of the transmitting input terminal 211M with the transmitting filter 233T and between continuity and discontinuity of the transmitting input terminal 211M with the transmitting filter 234T.

The switch 250M switches between continuity and discontinuity of each of the duplexers 233M, 234M with the input terminal of the low noise amplifier 220M. More specifically, the switch 250M is disposed in a receiving signal path connecting each of the receiving filters 233R, 234R with the low noise amplifier 220M and switches between continuity and discontinuity of the receiving filter 233R with the low noise amplifier 220M and between continuity and discontinuity of the receiving filter 234R with the low noise amplifier 220M.

The switch 260M switches between continuity and discontinuity of the antenna connection terminal 210M with each of the duplexers 233M, 234M.

In the middle band circuit 201M, the number of communication bands to be transmitted is not limited to two and may be only one or three or more. Depending on the number of communication bands, the number of duplexers, the configuration (for example, the number of selection terminals) of each switch, and the like are adjusted as needed.

The high band circuit 201H transmits a transmitting signal and a receiving signal in a communication band belonging to the high band group. As shown in FIG. 12, the high band circuit 201H includes a low noise amplifier 220H, duplexers 235H, 236H, and switches 240H, 250H, 260H.

Although not shown in FIG. 12, the high band circuit 201H may include a matching circuit for performing impedance matching between elements, a filter circuit that limits a pass band for a transmitting signal or a receiving signal, or the like. For example, a matching circuit 253 including an inductor is provided between the switch 240H and a transmitting filter 235T. A matching circuit including an inductor is provided between the switch 250H and a receiving filter 235R.

The power amplifier 205H is an example of a second power amplifier that amplifies a third transmitting signal group in a third band group. Specifically, the power amplifier 205H amplifies a transmitting signal in a communication band belonging to the high band group.

The low noise amplifier 220H is an example of a second low noise amplifier that amplifies a third receiving signal group in the third band group. Specifically, the low noise amplifier 220H is a receiving low noise amplifier that amplifies a receiving signal in a communication band belonging to the high band group with low noise.

The duplexers 235H, 236H are an example of a plurality of third filters respectively having pass bands corresponding to a plurality of third communication bands. The duplexer 235H and the duplexer 236H respectively have different pass bands.

The duplexer 235H passes, for example, a radio-frequency signal in a communication band E of the high band group. As shown in FIG. 12, the duplexer 235H is made up of the transmitting filter 235T and the receiving filter 235R. An input terminal of the transmitting filter 235T is connected to the transmitting input terminal 211H with the switch 240H interposed therebetween. An output terminal of the receiving filter 235R is connected to the receiving output terminal 212H with the switch 250H and the low noise amplifier 220H interposed therebetween. The output terminal of the transmitting filter 235T and the input terminal of the receiving filter 235R are connected to each other to make up a common terminal and are connected to the antenna connection terminal 210H with the switch 260H interposed therebetween.

The transmitting filter 235T is disposed in a transmitting signal path connecting the transmitting input terminal 211H with the antenna connection terminal 210H and passes a transmitting signal in a transmitting band of the communication band E, of transmitting signals amplified by the power amplifier 205H and inputted from the transmitting input terminal 211H. The receiving filter 235R is disposed in a receiving signal path connecting the antenna connection terminal 210H with the receiving output terminal 212H and passes a receiving signal in a receiving band of the communication band E, of receiving signals inputted from the antenna connection terminal 210H.

The duplexer 236H passes, for example, a radio-frequency signal in a communication band F of the high band group. The communication band F is a communication band different from the communication band E. As shown in FIG.

12, the duplexer 236H is made up of a transmitting filter 236T and a receiving filter 236R. An input terminal of the transmitting filter 236T is connected to the transmitting input terminal 211H with the switch 240H interposed therebetween. An output terminal of the receiving filter 236R is connected to the receiving output terminal 212H with the switch 250H and the low noise amplifier 220H interposed therebetween. The output terminal of the transmitting filter 236T and the input terminal of the receiving filter 236R are connected to each other to make up a common terminal and are connected to the antenna connection terminal 210H with the switch 260H interposed therebetween.

The transmitting filter 236T is disposed in a transmitting signal path connecting the transmitting input terminal 211H with the antenna connection terminal 210H and passes a transmitting signal in a transmitting band of the communication band F, of transmitting signals amplified by the power amplifier 205H and inputted from the transmitting input terminal 211H. The receiving filter 236R is disposed in a receiving signal path connecting the antenna connection terminal 210H with the receiving output terminal 212H and passes a receiving signal in a receiving band of the communication band F, of receiving signals inputted from the antenna connection terminal 210H.

The switch 240H switches between continuity and discontinuity of the transmitting input terminal 211H with each of the duplexers 235H, 236H. More specifically, the switch 240H is disposed in a transmitting signal path connecting the transmitting input terminal 211H with each of the transmitting filters 235T, 236T and switches between continuity and discontinuity of the transmitting input terminal 211H with the transmitting filter 235T and between continuity and discontinuity of the transmitting input terminal 211H with the transmitting filter 236T.

The switch 250H switches between continuity and discontinuity of each of the duplexers 235H, 236H with the input terminal of the low noise amplifier 220H. More specifically, the switch 250H is disposed in a receiving signal path connecting each of the receiving filters 235R, 236R with the low noise amplifier 220H and switches between continuity and discontinuity of the receiving filter 235R with the low noise amplifier 220H and between continuity and discontinuity of the receiving filter 236R with the low noise amplifier 220H.

The switch 260H switches between continuity and discontinuity of the antenna connection terminal 210H with each of the duplexers 235H, 236H.

In the high band circuit 201H, the number of communication bands to be transmitted is not limited to two and may be only one or three or more. Depending on the number of communication bands, the number of duplexers, the configuration (for example, the number of selection terminals) of each switch, and the like are adjusted as needed.

With the above configuration of the radio-frequency module 201 and the communication device 206, (1) simultaneous transmission of a signal in the low band group and a signal in the middle band group and (2) simultaneous transmission of a signal in the low band group and a signal in the high band group are achieved.

Figure 13:
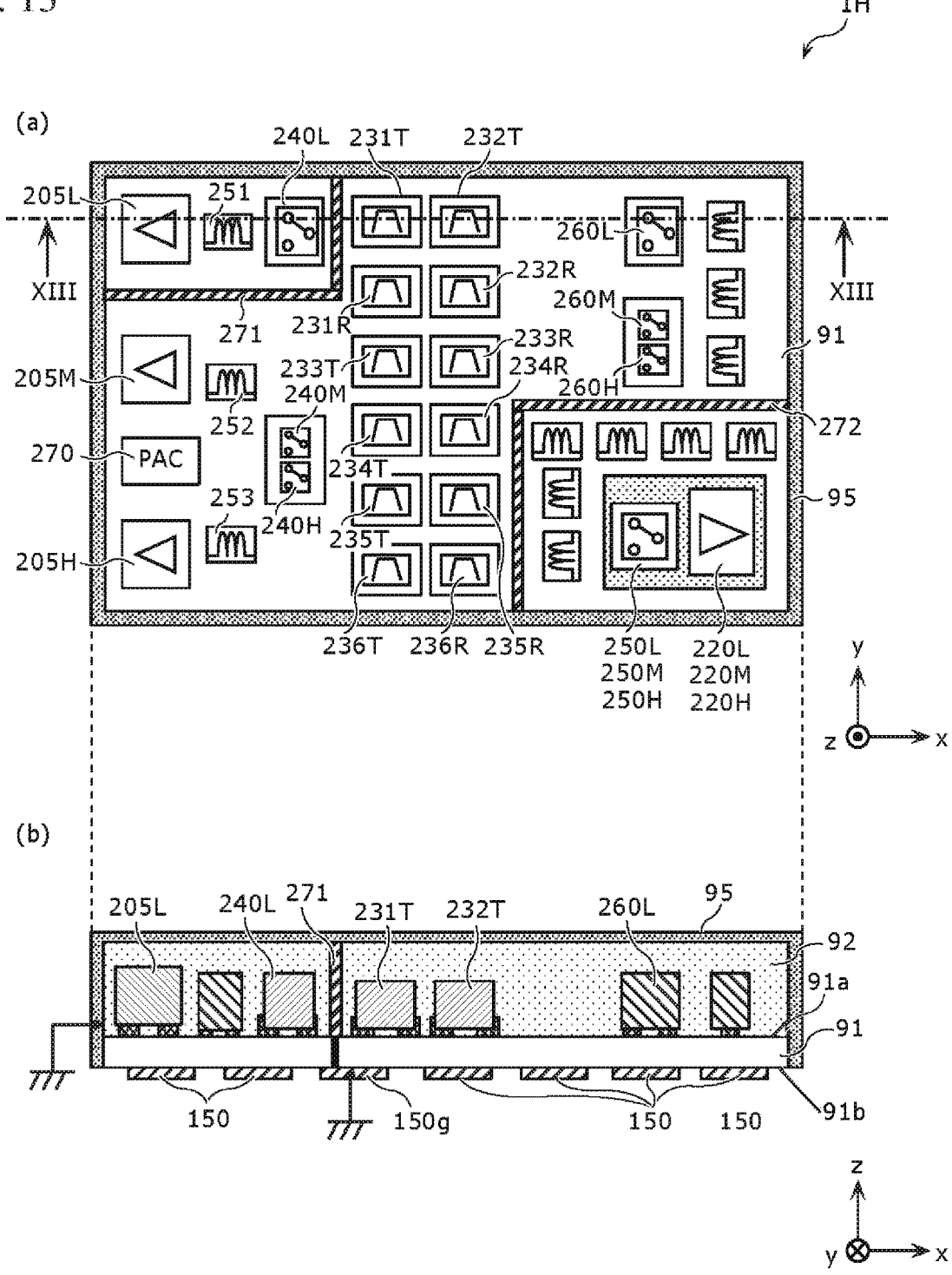
FIG. 13 shows a plan view and a cross-sectional view of the radio-frequency module according to the third embodiment.

3.2 Arrangement of Circuit Components of Radio-Frequency Module 201 According to Third Embodiment FIG. 13 shows a plan view and a cross-sectional view of the radio-frequency module 201 according to the third embodiment. In FIG. 13, (a) is an arrangement view of circuit components when the major surface 91a of the module substrate 91 is viewed from the positive side of the z-axis. In FIG. 13, (b) is a cross-sectional view taken along the line XIII-XIII in (a) of FIG. 13. The radio-frequency module 201 specifically shows the arrangement of the circuit components that make up the radio-frequency module 201 according to the third embodiment.

As shown in FIG. 13, the radio-frequency module 201 according to the present embodiment further includes the module substrate 91, metal shield plates 272, 272, the metal shield layer 95, the resin member 92, and the external connection terminals 150 in addition to the circuit configuration shown in FIG. 12.

The description of the same circuit components as those of the radio-frequency module 1 according to the first embodiment is omitted.

Each of the metal shield plates 271, 272 is an example of a first metal shield plate. Each of the metal shield plates 271, 272 is a metal wall upright from the major surface 91a toward the top surface, in the positive direction of the z-axis, of the resin member 92. The metal shield plates 271, 272 are in contact with the ground electrode of the major surface 91a and the metal shield layer 95. In other words, each of the metal shield plates 271, 272 is connected to the ground at least at two portions, that is, upper and lower portions, of the metal shield plate 271 or the metal shield plate 272, so an electromagnetic field shielding function is enhanced. The metal shield plates 271, 272 may be in contact with a shield surface that is in contact with the top surface of the resin member 92, of a shield surface that makes up the ground electrode of the major surface 91a and the metal shield layer 95, or may be in contact with a shield surface that is in contact with a side surface of the resin member 92, of a shield surface that makes up the ground electrode of the major surface 91a and the metal shield layer 95.

The metal shield plates 271, 272 partition the major surface 91a into three regions. As shown in (a) of FIG. 13, the power amplifier 205L, the matching circuit 251, and the switch 240L are disposed in a first region of the major surface 91a. The power amplifiers 205M, 205H, the matching circuits 252, 253, the PA control circuit 270, the switches 240M, 240H, 260L, 260M, 260H, the transmitting filters 231T to 236T, and the receiving filters 231R to 236R are disposed in a second region of the major surface 91a. The low noise amplifiers 220L, 220M, 220H, the switches 250L, 250M, 250H, and a matching circuit disposed in the receiving path are disposed in a third region of the major surface 91a.

Here, as shown in FIG. 13, the metal shield plate 271 is disposed on the major surface 91a between a first inductor of the matching circuit 251 and a second inductor of the matching circuit 252 (and a second inductor of the matching circuit 253) in a plan view of the module substrate 91.

With this configuration, the first inductor disposed in the transmitting path of the low band group and the second inductor disposed in the transmitting path of the middle band group and the high band group are disposed so as to sandwich the metal shield plate 271 set to the ground potential, so electromagnetic field coupling of the first inductor with the second inductor is suppressed. Thus, a decrease in the quality of a transmitting signal in each of the low band group, the middle band group, and the high band group is suppressed.

The metal shield plate 272 is disposed on the major surface 91a between the low noise amplifiers 220L, 220M, 220H and the matching circuit disposed in the receiving path and the power amplifiers 205L, 205M, 205H and the matching circuits 251, 252, 253 in a plan view of the module substrate 91.

With this configuration, superposition of a transmitting signal and its spurious waves on a receiving signal is suppressed. Thus, the isolation between the transmission and the reception is improved.

At least one of the metal shield plates 271, 272 just needs to be disposed between at least one of the power amplifier 205L and the matching circuit 251 and at least one of the low noise amplifiers 220M, 220H and the matching circuit connected to the low noise amplifiers 220M, 220H.

With this configuration, degradation of receiving sensitivity resulting from entry of second or third harmonic of the low band group into the receiving path of the middle band group or the high band group is suppressed.

Figure 14:
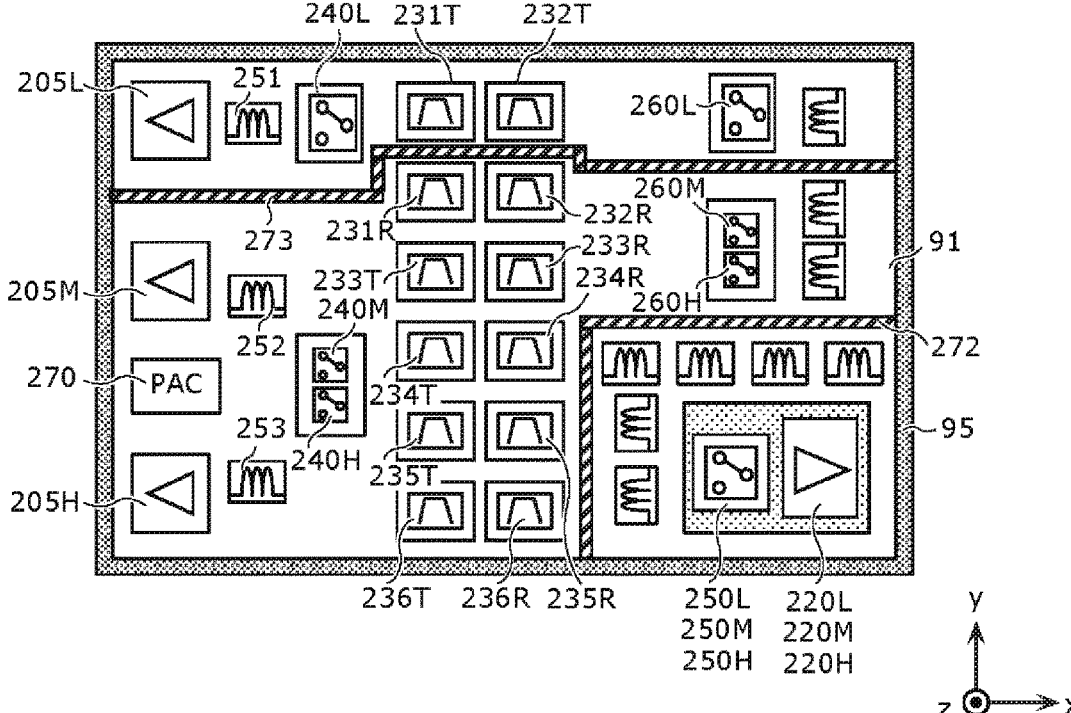
FIG. 14 is a plan view of a radio-frequency module according to a first modification of the third embodiment.

FIG. 14 is a plan view of a radio-frequency module 1J according to a first modification of the third embodiment. The radio-frequency module 1J shown in the drawing differs from the radio-frequency module 201 according to the third embodiment in that a metal shield plate 273 is disposed instead of the metal shield plate 271. Hereinafter, for the radio-frequency module 1J according to the present modification, the description of the same points as those of the radio-frequency module 201 according to the third embodiment is omitted, and different points will be mainly described.

The radio-frequency module 1J according to the present modification further includes the module substrate 91, the metal shield plates 273, 272, the metal shield layer 95, the resin member 92, and the external connection terminals 150 in addition to the circuit configuration shown in FIG. 12.

The description of the same circuit components as those of the radio-frequency module 1 according to the first embodiment is omitted.

Each of the metal shield plates 273, 272 is an example of a first metal shield plate. Each of the metal shield plates 271, 272 is a metal wall upright from the major surface 91a toward the top surface, in the positive direction of the z-axis, of the resin member 92. The metal shield plates 273, 272 are in contact with the ground electrode of the major surface 91a and the metal shield layer 95. In other words, each of the metal shield plates 273, 272 is connected to the ground at least at two portions, that is, upper and lower portions, of the metal shield plate 273 or the metal shield plate 272, so an electromagnetic field shielding function is enhanced. The metal shield plates 273, 272 may be in contact with a shield surface that is in contact with the top surface of the resin member 92, of a shield surface that makes up the ground electrode of the major surface 91a and the metal shield layer 95, or may be in contact with a shield surface that is in contact with a side surface of the resin member 92, of a shield surface that makes up the ground electrode of the major surface 91a and the metal shield layer 95.

The metal shield plates 273, 272 partition the major surface 91a into three regions. As shown in FIG. 14, the power amplifier 205L, the matching circuit 251, the switches 240L, 260L, and the transmitting filters 231T, 232T are disposed in a first region of the major surface 91a. The power amplifiers 205M, 205H, the matching circuits 252, 253, the PA control circuit 270, the switches 240M, 240H, 260M, 260H, the transmitting filters 233T to 236T, and the receiving filters 231R to 236R are disposed in a second region of the major surface 91a. The low noise amplifiers 220L, 220M, 220H, the switches 250L, 250M, 250H, and a matching circuit disposed in the receiving path are disposed in a third region of the major surface 91a.

With this configuration, with the metal shield plate 273, degradation of receiving sensitivity resulting from entry of second or third harmonic of the low band group into the receiving path of the middle band group or the high band group is further suppressed.

Figure 15A:
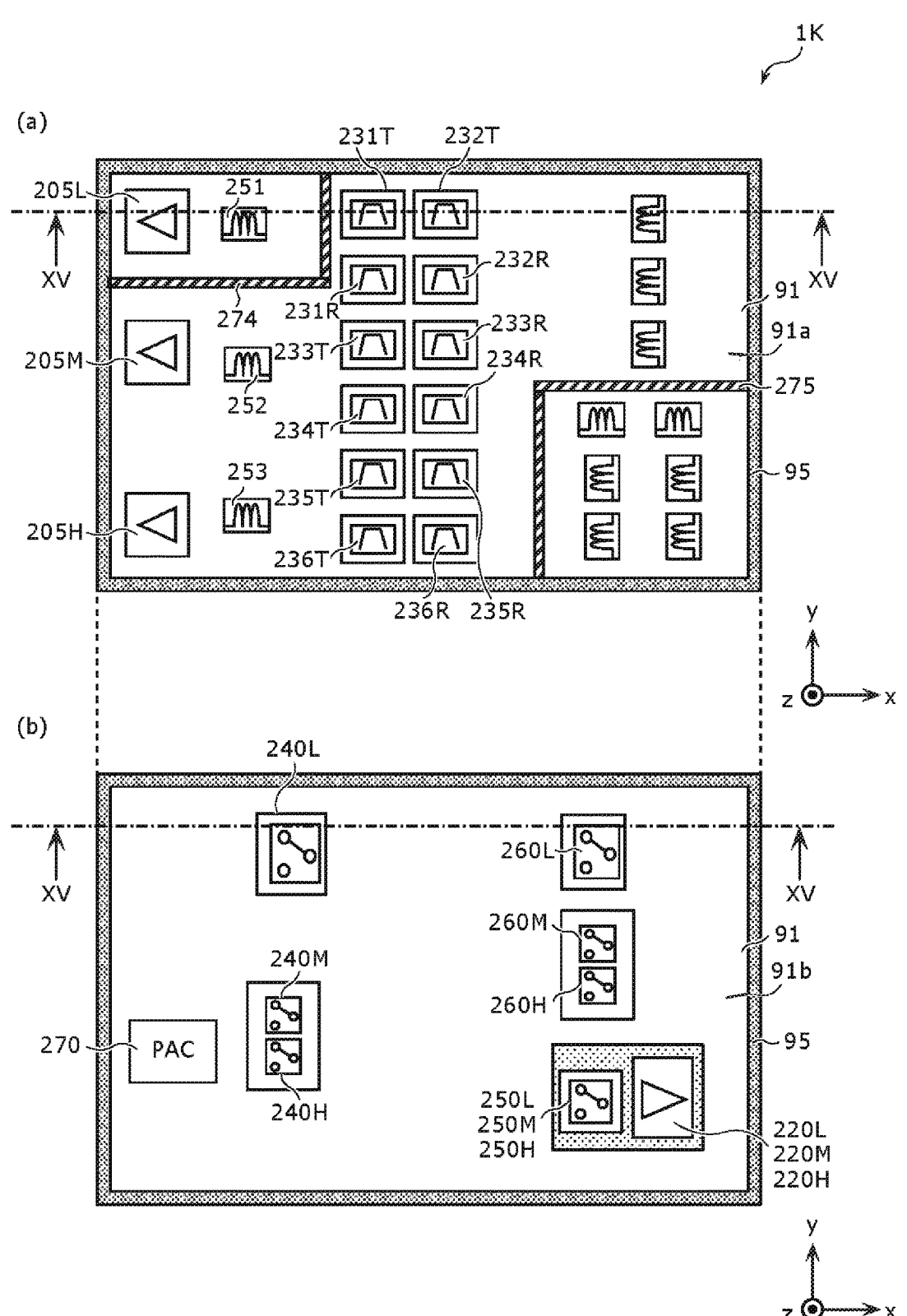
FIG. 15A is a plan view of a radio-frequency module according to a second modification of the third embodiment.
Figure 15B:
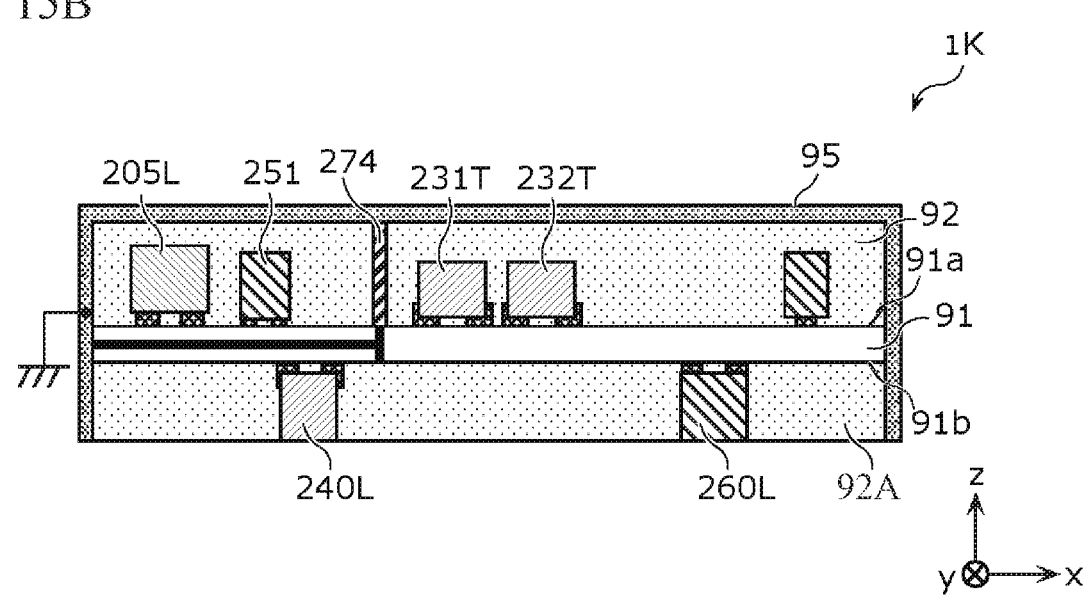
FIG. 15B is a cross-sectional view of the radio-frequency module according to the second modification of the third embodiment.

FIG. 15A is a plan view of a radio-frequency module 1K according to a second modification of the third embodiment. FIG. 15B is a cross-sectional view of the radio-frequency module 1K according to the second modification of the third embodiment. In FIG. 15A, (a) is an arrangement view of circuit components when the major surface 91a of the module substrate 91 is viewed from the positive side of the z-axis. In FIG. 15A, (b) is an arrangement view of circuit components when the major surface 91b of the module substrate 91 is seen through from the positive side of the z-axis. FIG. 15B is a cross-sectional view taken along the line XV-XV in (a) and (b) of FIG. 15A. The radio-frequency module 1K specifically shows the arrangement of the circuit components that make up the radio-frequency module 201 according to the third embodiment.

As shown in FIGS. 15A and 15B, the radio-frequency module 1K according to the present modification further includes the module substrate 91, metal shield plates 274, 275, the metal shield layer 95, the resin member 92, and the external connection terminals 150 in addition to the circuit configuration shown in FIG. 12.

The description of the same circuit components as those of the radio-frequency module 1 according to the first embodiment is omitted.

The module substrate 91 has the major surfaces 91a, 91b opposite to each other. Examples of the module substrate 91 include an LTCC substrate having a multilayer structure of a plurality of dielectric layers, an HTCC substrate, a component built-in substrate, a substrate having an RDL, and a printed circuit board.

The resin member 92 covers electronic components mounted on or above the major surface 91a of the module substrate 91. The resin member 92A covers electronic components mounted on or above the major surface 91b of the module substrate 91. The resin members 92, 92A are not indispensable component elements for the radio-frequency module according to the present embodiment. The radio-frequency module 1K does not need to include the resin members 92, 92A.

Each of the metal shield plates 274, 275 is an example of a first metal shield plate. Each of the metal shield plates 274, 275 is a metal wall upright from the major surface 91a toward a top surface, in the positive direction of the z-axis, of the resin member 92. The metal shield plates 274, 275 are in contact with a ground electrode of the major surface 91a and the metal shield layer 95. In other words, each of the metal shield plates 274, 275 is connected to the ground at least at two upper and lower parts of the metal shield plate 274 or the metal shield plate 275, so an electromagnetic field shielding function is enhanced. The metal shield plates 274, 275 may be in contact with a shield surface that is in contact with the top surface of the resin member 92, of a shield surface that makes up the ground electrode of the major surface 91a and the metal shield layer 95, or may be in contact with a shield surface that is in contact with a side surface of the resin member 92, of a shield surface that makes up the ground electrode of the major surface 91a and the metal shield layer 95.

The metal shield plates 274, 275 partition the major surface 91a into three regions. As shown in FIG. 15A, the power amplifier 205L and the matching circuit 251 are disposed in a first region of the major surface 91a. The power amplifiers 205M, 205H, the matching circuits 252, 253, the transmitting filters 231T to 236T, and the receiving filters 231R to 236R are disposed in a second region of the major surface 91a. A matching circuit disposed in a receiving path is disposed in a third region of the major surface 91a.

With this configuration, the first inductor disposed in the transmitting path of the low band group and the second inductor disposed in the transmitting path of the middle band group and the high band group are disposed so as to sandwich the metal shield plate 271 set to the ground potential, so electromagnetic field coupling of the first inductor with the second inductor is suppressed. Thus, a decrease in the quality of a transmitting signal in each of the low band group, the middle band group, and the high band group is suppressed.

The metal shield plate 275 is disposed on the major surface 91a between the matching circuit disposed in the receiving path and the power amplifiers 205L, 205M, 205H and the matching circuits 251, 252, 253 in a plan view of the module substrate 91.

With this configuration, superposition of a transmitting signal and its spurious waves on a receiving signal is suppressed. Thus, the isolation between the transmission and the reception is improved.

The PA control circuit 270, the switches 240L, 240M, 240H, 250L, 250M, 250H, 260L, 260M, 260H, and the low noise amplifiers 220L, 220M, 220H are disposed on or above the major surface 90b.

With this configuration, circuit components that make up the radio-frequency module 1K are disposed so as to be distributed to both surfaces of the module substrate 91, so the size of the radio-frequency module 1K is reduced.

Here, at least one of the power amplifier 205L and the matching circuit 251 is disposed on or above the major surface 90a, and the low noise amplifiers 250M, 250H are disposed on or above the major surface 90b. In a plan view of the module substrate 91, at least one of the power amplifier 205L and the matching circuit 251 does not overlap the low noise amplifiers 250M, 250H.

With this configuration, degradation of receiving sensitivity resulting from entry of second or third harmonic of the low band group into the receiving path of the middle band group or the high band group is further suppressed.

3. Advantageous Effects

The radio-frequency module 1A according to the present embodiment includes a module substrate 91 having a major surface 91a, a first inductor and a second inductor disposed on or above the major surface 91a, a resin member 92 covering at least part of the major surface 91a, the first inductor, and the second inductor, a metal shield layer 95 covering a surface of the resin member 92 and set to a ground potential, and a metal shield plate 70 disposed on the major surface 91a between the first inductor and the second inductor in a plan view of the module substrate 91. The metal shield plate 70 is in contact with a ground electrode of the major surface 91a and the metal shield layer 95. The first inductor is disposed in any one of a transmitting path AT connecting a common terminal 40a with a transmitting input terminal 110 for receiving a transmitting signal from an outside source, a receiving path AR connecting the common terminal 40a with a receiving output terminal 120 for supplying a receiving signal to an outside source, and a transmitting and receiving path CTR connecting an antenna connection terminal 100 with the common terminal 40a. The second inductor is disposed in any one of the transmitting path AT, the receiving path AR, and the transmitting and receiving path CTR, other than the path in which the first inductor is disposed.

With this configuration, the first inductor and the second inductor are disposed so as to sandwich the metal shield plate 70 set to the ground potential, so electromagnetic field coupling of the first inductor with the second inductor is suppressed. Thus, for example, a decrease in the quality of a transmitting signal resulting from the output of a high-power transmitting signal amplified by the power amplifier 10 and on which a harmonic component is superposed from the antenna connection terminal 100 without passing through the transmitting filter 31 is suppressed. Degradation of receiving sensitivity resulting from flow of the harmonics or spurious waves, such as intermodulation distortion between a transmitting signal and another radio-frequency signal, into the receiving path AR due to the electromagnetic field coupling is suppressed.

In the radio-frequency module 1A, the metal shield plate 70A may be upright from the major surface 91a toward a top surface of the resin member 92, and a hole 72 extending through the metal shield plate 70A in a direction normal to the metal shield plate 70A may be formed between the metal shield plate 70A and the major surface 91a.

With this configuration, since the hole 72 is formed between the main body portion 71 and the major surface 91a, good flowability of liquid resin is ensured near the metal shield plate 70A in the process of forming the resin member 92 on the major surface 91a. Thus, generation of voids or the like where the resin member 92 is not formed near the metal shield plate 70A is suppressed.

In the radio-frequency module 1A, in a plan view of the module substrate 91, a main body portion 71 of the metal shield plate 70, sandwiched by adjacent two of the holes 72, may be disposed in a region S in which the first inductor and the second inductor face each other.

With this configuration, of an electromagnetic field formed by the first inductor and the second inductor, a high-intensity electromagnetic field is blocked by the main body portion 71. Thus, electromagnetic field coupling of the first inductor with the second inductor is effectively suppressed.

In the radio-frequency module 1A, the metal shield plate 70B may be upright from the major surface 91a toward a top surface of the resin member 92, and a hole 72 extending through the metal shield plate 70B in a direction normal to the metal shield plate 70B may be formed between the metal shield plate 70B and the top surface.

With this configuration, since the hole 72 is formed between the main body portion 71 and the top surface, good flowability of liquid resin is ensured near the metal shield plate 70B in the process of forming the resin member 92 on the major surface 91a. Thus, generation of voids or the like where the resin member 92 is not formed near the metal shield plate 70B is suppressed. In addition, since the hole 72 is not formed in a region that is in contact with the major surface 91a (a lower region of the main body portion 71), the isolation between circuit components disposed on the major surface 91a with the metal shield plate 70B interposed therebetween is improved.

The metal shield plate 70 may have a main body portion 71 upright from the major surface 91a toward a top surface of the resin member 92, and a joining portion 73 extended parallel to the major surface 91a on the major surface 91a side and joined with a ground electrode of the major surface 91a.

With this configuration, the metal shield plate 70 and the major surface 91_a_ are joined with each other by the joining portion 73, so the arrangement accuracy of the metal shield plate 70 and the bonding strength of the metal shield plate 70 with the major surface 91_a_ are improved.

The radio-frequency module 1C according to the second modification of the first embodiment may include a first component and a second component disposed on or above the major surface 91_a_. The first component may have an electrode on a side surface. The second component may have an electrode on a bottom surface and does not need to have an electrode on a side surface. In a plan view of the module substrate 91, an electrically conductive member does not need to be disposed between the first component and the metal shield plate 70A. An electrically conductive member does not need to be disposed between the second component and the metal shield plate 70A. The joining portion 73 may be disposed between the first component and the main body portion 71 and does not need to be disposed between the second component and the main body portion 71.

With this configuration, in the metal shield plate 70A, the joining portion 73 is extended to the region P side, so the metal shield plate 70A more easily fall down to the region Q side where no joining portion 73 is provided in the process in which the metal shield plate 70A is upright on the major surface 91_a_. In contrast, in the radio-frequency module 1C, the first component is disposed on the region P side to which the main body portion 71 is hard to fall down, and the second component is disposed on the region Q side where the main body portion 71 is easy to fall down. Thus, even when the main body portion 71 inclines and contacts with the first component, electrical contact of the main body portion 71 with solder interposed therebetween is suppressed.

In the radio-frequency module 1A, the metal shield plate 70 may have a plurality of the joining portions 73, the main body portion 71 may be extended in the first direction in a plan view of the module substrate 91, the module substrate 91 may have a first region and a second region partitioned by the main body portion 71 in the plan view, and the plurality of joining portions 73 may be disposed alternately in the first region and the second region along the first direction.

With this configuration, when the metal shield plate 70 is mounted on the module substrate 91, the metal shield plate 70 is not inclined with respect to the module substrate 91 and is upright perpendicularly to the module substrate 91. Even when solder joining the module substrate 91 with the joining portions 73 melts, the amount of solder is equalized between the right and left sides of the main body portion 71, so the metal shield plate 70 is stably disposed and does not move.

In the radio-frequency module 1A, a first part of the metal shield layer 95 is in proximity to the metal shield plate 70 in a direction parallel to the metal shield layer 95, a second part of the metal shield layer 95 is farther from the metal shield plate 70 than the first part, and a thickness of the metal shield layer 95 in the first part is greater than a thickness of the metal shield layer 95 in the second part.

With this configuration, the area of contact between the metal shield plate 70 and the metal shield layer 95 is increased. Thus, the electrical continuity between the metal shield plate 70 and the metal shield layer 95 is improved, and the potentials of both are stable, so a shielding effect is improved. Since the metal shield layer 95 is connected to the ground of the module substrate 90 with the metal shield plate 70 interposed therebetween, the heat dissipation of the heat generated from the power amplifier 10 is improved.

In the radio-frequency module 1A, a third part of the metal shield layer 95 is in proximity to the metal shield plate 70 in a direction normal to the metal shield layer 95, a fourth part of the metal shield layer 95 is farther from the metal shield plate 70 than the third part, and a thickness of the metal shield layer 95 in the third part is less than a thickness of the metal shield layer 95 in the fourth part.

With this configuration, since the side surface of a distal end portion of the metal shield plate 70 is in contact with the metal shield layer 95, the area of contact between the metal shield plate 70 and the metal shield layer 95 is increased. Thus, the electrical continuity between the metal shield plate 70 and the metal shield layer 95 is improved, and the potentials of both are stable, so a shielding effect is improved. Since the metal shield layer 95 is connected to the ground of the module substrate 90 with the metal shield plate 70 interposed therebetween, the heat dissipation of the heat generated from the power amplifier 10 is improved.

The radio-frequency module 1G according to the modification of the second embodiment may further include a metal shield plate 75_b_ disposed apart from the metal shield plate 75_a_ in a plan view of the module substrate 91.

In the radio-frequency module 1G, the metal shield plates 75_a_, 75_b_ may have an overlapping part when viewed in a direction normal to the metal shield plates 75_a_, 75_b_, and the metal shield plate 75_a_ and the metal shield plate 75_b_ may be parallel to each other at the overlapping part.

With this configuration, the electromagnetic field shielding function of the metal shield plate is enhanced by the overlapping part.

In the radio-frequency module 1G, in a plan view of the module substrate 91, the overlapping part may be disposed between the first inductor and the second inductor.

With this configuration, the first inductor and the second inductor are disposed so as to sandwich the overlapping part, so electromagnetic field coupling of the first inductor with the second inductor is further suppressed.

In the radio-frequency module 1G, the metal shield plate 75_a_ and the metal shield plate 75_b_ may have the same shape.

With this configuration, a manufacturing process for the metal shield plates is simplified, so a manufacturing cost is reduced.

In the radio-frequency module 1G, in a plan view of the module substrate 91, the inductor of the matching circuit 52 may be surrounded by the metal shield plates 76_a_, 76_b_ and the metal shield layer 95.

In the radio-frequency module 1F, in a plan view of the module substrate 91, the inductor of the matching circuit 52 may be surrounded by the metal shield plate 74.

With this configuration, flow of a high-power transmitting signal, its harmonics, and an intermodulation distortion component into the receiving path AR is suppressed to a high degree.

The radio-frequency module 1F further includes a receiving filter 32 for frequency division duplex, disposed on the major surface adjacent to the metal shield plate 74 and a wire 81 in the receiving path, connecting the matching circuit 52 with the receiving filter 32. The metal shield plate 74 is disposed between the matching circuit 52 and the receiving filter 32. Part of the wire 81 overlaps the hole 72 in a plan view of the module substrate 91.

With this configuration, unnecessary signals that transmit through the wire 81 are suppressed by the hole 72, so a good shielding effect of the radio-frequency module 1F is obtained.

The radio-frequency module 1K further includes a power amplifier 205L that amplifies a transmitting signal in a low band group, second power amplifiers 205M, 205H that amplify a transmitting signal in at least one of a middle band group and a high band group, a low noise amplifier 220L that amplifies a receiving signal in the low band group, and low noise amplifiers 220M, 220H amplify a receiving signal in at least one of the middle band group and the high band group. The module substrate 91 has major surfaces 91a, 91b opposite to each other. The matching circuit 251 is connected to an output end of the power amplifier 205L. The matching circuit 252 (253) is connected to an output end of the power amplifier 205M (205H). At least one of the power amplifier 205L and the matching circuit 251 is disposed on or above the major surface 90a. The low noise amplifiers 220M, 220H are disposed on or above the major surface 90b. In a plan view of the module substrate 91, at least one of the power amplifier 205L and the matching circuit 251 does not overlap the low noise amplifier 220M or the low noise amplifier 220H.

With this configuration, degradation of receiving sensitivity resulting from entry of second or third harmonic of the low band group into the receiving path of the middle band group or the high band group is further suppressed.

In the radio-frequency module 1B, a third inductor of the matching circuit 53 may have an electrode on a side surface, the duplexer 30 may have an electrode on a bottom surface and does not need to have an electrode on a side surface, in a plan view of the module substrate 91, an electrically conductive member does not need to be disposed between the third inductor and the metal shield plate 70, an electrically conductive member does not need to be disposed between the duplexer 30 and the metal shield plate 70, and a distance D1 between the third inductor and the metal shield plate 70 may be greater than a distance D2 between the duplexer 30 and the metal shield plate 70.

With this configuration, the side surface of the third inductor and the main body portion 71 of the metal shield plate 70 easily contact with each other with solder interposed therebetween. In contrast, the side surface of the duplexer 30 and the main body portion 71 of the metal shield plate 70 do not contact with each other with solder interposed therebetween even when approaching each other. In contrast, since the distance D1 is greater than the distance D2, the contact of the third inductor with the main body portion 71 with solder interposed therebetween is suppressed.

In the radio-frequency module 1D, a bottom surface electrode of the duplexer 30 may be connected to an electrode of the major surface 91a, and a top surface of the duplexer 30 may be in contact with the metal shield layer 95.

With this configuration, in the manufacturing process, the top surface of the duplexer 30 can be exposed from the resin member 92 by polishing the top surface of the resin member 92. After that, the metal shield layer 95 can be formed directly on the top surface of the duplexer 30. Thus, the profile of the radio-frequency module 1D is reduced, and the grounding and heat dissipation of the duplexer 30 are enhanced.

In the radio-frequency module 1D, the duplexer 30 may be an acoustic wave filter.

With this configuration, since the heat dissipation of the acoustic wave filter is enhanced, a frequency drift due to a temperature change in the acoustic wave filter is reduced.

In the radio-frequency module 1D, the duplexer 30 may be disposed between the first inductor and the second inductor in a plan view of the module substrate 91.

With this configuration, since the first inductor and the second inductor are disposed so as to sandwich not only the metal shield plate 70 set to the ground potential but also the duplexer 30 of which the top surface is set to the ground potential, electromagnetic field coupling of the first inductor with the second inductor is further suppressed.

In the radio-frequency module 1E, the second inductor of the matching circuit 51 may have a signal electrode 51h and a ground electrode 51g on a bottom surface, and a distance between the ground electrode 51g and the metal shield plate 70 may be shorter than a distance between the signal electrode 51h and the metal shield plate 70.

With this configuration, the signal electrode 51h is less likely to contact with the metal shield plate 70 than the ground electrode 51g in the manufacturing process. If the ground electrode 51g and the metal shield plate 70 contact with each other, the ground electrode 51g and the metal shield plate 70 have the same ground potential, so the electrical characteristics of the radio-frequency module 1E are not impaired. Thus, degradation of the electrical characteristics of the radio-frequency module 1E resulting from contact of the signal electrode 51h with the metal shield plate 70 is suppressed.

In the radio-frequency module 1E, the ground electrode 51g and the metal shield plate 70 may be joined with the same ground electrode 91g formed on the major surface 91a.

With this configuration, since the area of the ground electrode 91g formed on the major surface 91a to which the ground electrode 51g and the metal shield plate 70 are connected is reduced, the area of the module substrate 91 is saved.

The radio-frequency module 1F may further include a third inductor disposed on or above the major surface 91a, and a metal shield plate 74 disposed on the major surface 91a between the third inductor and the second inductor or between the third inductor and the first inductor in a plan view of the module substrate 91. The metal shield plate 74 may be in contact with the ground electrode of the major surface 91a and the metal shield layer 95. The third inductor may be disposed in any one of the transmitting path AT, the receiving path AR, and the transmitting and receiving path CTR, other than the path in which the first inductor is disposed or the path in which the second inductor is disposed.

With this configuration, for example, the second inductor disposed in the transmitting path AT and the first inductor disposed in the transmitting and receiving path CTR are disposed so as to sandwich the metal shield plate 70 set to the ground potential, so electromagnetic field coupling of the first inductor with the second inductor is suppressed. For example, the first inductor disposed in the transmitting and receiving path CTR and the third inductor disposed in the receiving path AR are disposed so as to sandwich the metal shield plate 74 set to the ground potential, so electromagnetic field coupling of the first inductor with the third inductor is suppressed. Thus, a decrease in the quality of a transmitting signal resulting from the output of a high-power transmitting signal amplified by the power amplifier 10 and on which a harmonic component is superposed from the antenna connection terminal 100 without passing through the transmitting filter 31 is suppressed. Degradation of receiving sensitivity resulting from flow of the harmonics or spurious waves, such as intermodulation distortion between a transmitting signal and another radio-frequency signal, into the receiving path AR due to the electromagnetic field coupling is further suppressed.

The communication device 5 includes an RFIC 3 that processes a radio-frequency signal that is transmitted or received by an antenna 2, and the radio-frequency module 1 that transmits a radio-frequency signal between the antenna 2 and the RFIC 3.

With this configuration, the communication device 5 in which degradation of the quality of a transmitting signal or a receiving signal is suppressed is provided.

Other Embodiments, and Others

The radio-frequency module and the communication device according to the present embodiment have been described by way of the embodiments and their modifications; however, the radio-frequency module and the communication device according to the present embodiment are not limited to the embodiments and their modifications. The present disclosure also encompasses other embodiments implemented by combining selected component elements of the above-described embodiments and their modifications, modifications obtained by applying various alterations that are conceived of by persons skilled in the art to the above-described embodiments and their modifications without departing from the purport of the present disclosure, and various devices that include the radio-frequency module or the communication device.

For example, in each of the radio-frequency modules according to the first and second embodiments, the circuit components that make up the radio-frequency module are disposed on or above one major surface of the module substrate 91. Alternatively, the circuit components may be disposed so as to be distributed to the mutually opposite first major surface and second major surface of the module substrate. In other words, the circuit components that make up the radio-frequency module may be mounted on one side or mounted on both sides of the module substrate.

For example, in the radio-frequency modules and the communication devices according to the embodiments and their modifications, another circuit element, wire, and the like may be inserted between paths that connect circuit elements and signal paths disclosed in the drawings.

The present disclosure is widely usable in communication equipment, such as cellular phones, as a radio-frequency module disposed in a front-end portion that supports multiband feature.

What is claimed is:

1. A radio-frequency module comprising:
a module substrate having a major surface;
a first inductor and a second inductor on or above the major surface;
resin covering at least part of the major surface, the first inductor, and the second inductor;
a metal shield layer covering a surface of the resin and being at a ground potential; and
a first metal shield plate on the major surface between the first inductor and the second inductor as seen in a plan view of the module substrate,
wherein the first metal shield plate is in contact with a ground electrode of the major surface and the metal shield layer,
wherein the first inductor is in any one of a transmitting path through which a transmitting signal is transmitted, a receiving path through which a receiving signal is transmitted, or a transmitting and receiving path through which the transmitting signal and the receiving signal are transmitted,
wherein the second inductor is in a different one of the transmitting path, the receiving path, or the transmitting and receiving path than the first inductor, wherein the first metal shield plate is upright from the major surface toward a top surface of the resin, and
wherein a hole extends through the first metal shield plate in a direction normal to the first metal shield plate between the first metal shield plate and the major surface, or between the first metal shield plate and the top surface.

2. The radio-frequency module according to claim 1, wherein in the plan view of the module substrate, the first metal shield plate is sandwiched by adjacent two of the holes and is in a region in which the first inductor and the second inductor face each other.

3. The radio-frequency module according to claim 1, wherein in the plan view of the module substrate, the hole is in a region in which the first inductor and the second inductor face each other.

4. The radio-frequency module according to claim 1, wherein the first metal shield plate comprises:
a main body portion upright from the major surface toward a top surface of the resin, and
a joining portion extended parallel to the major surface on the major surface side and joined with the ground electrode.

5. The radio-frequency module according to claim 4, wherein the first metal shield plate has a plurality of the joining portions,
in the plan view of the module substrate, the main body portion extends in a first direction,
the module substrate has a first region and a second region partitioned by the main body portion in the plan view, and
different ones of the joining portions are alternately in the first region and the second region along the first direction.

6. The radio-frequency module according to claim 1, wherein a first part of the metal shield layer is in proximity to the first metal shield plate in a direction parallel to the metal shield layer,
wherein a second part of the metal shield layer is farther from the first metal shield plate than the first part, and
wherein a thickness of the metal shield layer in the first part is greater than a thickness of the metal shield layer in the second part.

7. The radio-frequency module according to claim 1, wherein a third part of the metal shield layer is in proximity to the first metal shield plate in a direction normal to the metal shield layer,
wherein a fourth part of the metal shield layer is farther from the first metal shield plate than the third part, and
wherein a thickness of the metal shield layer in the third part is less than a thickness of the metal shield layer in the fourth part.

8. The radio-frequency module according to claim 1, further comprising:
a second metal shield plate apart from the first metal shield plate in the plan view of the module substrate.

9. The radio-frequency module according to claim 8, wherein the first metal shield plate and the second metal shield plate at least partially overlap in a direction normal to the second metal shield plate, and
wherein the first metal shield plate and the second metal shield plate are parallel to each other where the first metal shield plate and the second metal shield plate overlap.

10. The radio-frequency module according to claim 9, wherein in the plan view of the module substrate, the first metal shield plate and the second metal shield plate overlap between the first inductor and the second inductor.

11. The radio-frequency module according to claim 8, wherein the first metal shield plate and the second metal shield plate have the same shape.

12. The radio-frequency module according to claim 1, wherein the first inductor is in the receiving path, and wherein in the plan view of the module substrate, the first inductor is surrounded by the first metal shield plate and the metal shield layer.

13. The radio-frequency module according to claim 1, wherein the first inductor is in the receiving path, and wherein in the plan view of the module substrate, the first inductor is surrounded by the first metal shield plate.

14. The radio-frequency module according to claim 1, further comprising:

a receiving filter for frequency division duplex, that is adjacent to the first metal shield plate on the major surface; and a first wire in the receiving path that connects the first inductor with the receiving filter, wherein the first metal shield plate is between the first inductor and the receiving filter, and in the plan view of the module substrate, part of the first wire overlaps the hole.

15. The radio-frequency module according to claim 1, further comprising:

a filter on or above the major surface, wherein a bottom surface electrode of the filter is connected to an electrode on the major surface, and a top surface of the filter is in contact with the metal shield layer.

16. The radio-frequency module according to claim 15, wherein in the plan view of the module substrate, the filter is between the first inductor and the second inductor.

17. The radio-frequency module according to claim 1, further comprising:

a third inductor on or above the major surface; and a third metal shield plate on the major surface, wherein in the plan view of the module substrate, the third metal shield plate is between the third inductor and the second inductor, or between the third inductor and the first inductor, wherein the third metal shield plate is in contact with the ground electrode of the major surface and the metal shield layer, and wherein the third inductor is in a different one of the transmitting path, the receiving path, or the transmitting and receiving path than the first inductor or the second inductor.

18. A radio-frequency module comprising:

a module substrate having a major surface;

a first inductor and a second inductor on or above the major surface;

resin covering at least part of the major surface, the first inductor, and the second inductor;

a metal shield layer covering a surface of the resin and being at a ground potential; and a first metal shield plate on the major surface between the first inductor and the second inductor as seen in a plan view of the module substrate, a first circuit component and a second circuit component on or above the major surface, wherein the first metal shield plate is in contact with a ground electrode of the major surface and the metal shield layer, wherein the first inductor is in any one of a transmitting path through which a transmitting signal is transmitted, a receiving path through which a receiving signal is transmitted, or a transmitting and receiving path through which the transmitting signal and the receiving signal are transmitted, wherein the second inductor is in a different one of the transmitting path, the receiving path, or the transmitting and receiving path than the first inductor, wherein the first metal shield plate comprises:

a main body portion upright from the major surface toward a top surface of the resin, and a joining portion extended parallel to the major surface on the major surface side and joined with the ground electrode, wherein the first circuit component has an electrode on a side surface, wherein the second circuit component has an electrode on a bottom surface and does not have an electrode on a side surface, and wherein in the plan view of the module substrate:

no electrical conductor is between the first circuit component and the first metal shield plate, no electrical conductor is between the second circuit component and the first metal shield plate, and the joining portion is between the first circuit component and the main body portion, and is not between the second circuit component and the main body portion.

19. A radio-frequency module comprising:

a module substrate having a major surface;

a first inductor and a second inductor on or above the major surface;

resin covering at least part of the major surface, the first inductor, and the second inductor;

a metal shield layer covering a surface of the resin and being at a ground potential;

a first metal shield plate on the major surface between the first inductor and the second inductor as seen in a plan view of the module substrate, a first power amplifier configured to amplify a transmitting signal in a low band group;

a second power amplifier configured to amplify a transmitting signal in a middle band group or a high band group;

a first low noise amplifier configured to amplify a receiving signal in the low band group; and a second low noise amplifier configured to amplify a receiving signal in the middle band group or the high band group, wherein the first metal shield plate is in contact with a ground electrode of the major surface and the metal shield layer, wherein the first inductor is in any one of a transmitting path through which a transmitting signal is transmitted, a receiving path through which a receiving signal is transmitted, or a transmitting and receiving path through which the transmitting signal and the receiving signal are transmitted, wherein the second inductor is in a different one of the transmitting path, the receiving path, or the transmitting and receiving path than the first inductor, wherein the module substrate has a first major surface and a second major surface opposite to each other, wherein the first inductor is connected to an output end of the first power amplifier, wherein the second inductor is connected to an output end of the second power amplifier, wherein the first power amplifier or the first inductor is on or above the first major surface, wherein the second low noise amplifier is on or above the second major surface, and wherein in the plan view of the module substrate, the second low noise amplifier, and the first power amplifier or the first inductor, do not overlap each other.

* * * * *